(12) United States Patent  (10) Patent No.: US 7,253,448 B2
Roberts et al.  (45) Date of Patent: *Aug. 7, 2007

(54) SEMICONDUCTOR RADIATION EMITTER PACKAGE

(75) Inventors: John K. Roberts, East Grand Rapids, MI (US); Joseph S. Stam, Holland, MI (US); Spencer D. Reese, Fort Wayne, IN (US); Robert R. Turnbull, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 36 days.

This patent is subject to a terminal disclaimer.

(21) Appl. No.: 11/005,459

(22) Filed: Dec. 6, 2004

(65) Prior Publication Data

US 2005/0077623 A1  Apr. 14, 2005

Related U.S. Application Data

(60) Continuation of application No. 09/935,443, filed on Aug. 23, 2001, now Pat. No. 6,828,170, which is a division of application No. 09/426,795, filed on Oct. 22, 1999, now Pat. No. 6,335,548.

(60) Provisional application No. 60/124,493, filed on Mar. 15, 1999.

(51) Int. Cl.
  *H01L 29/22* (2006.01)
(52) U.S. Cl. .......................................... 257/99; 372/36
(58) Field of Classification Search .......... 257/99–100, 257/98, 431–434; 372/26
  See application file for complete search history.

(56) References Cited

U.S. PATENT DOCUMENTS 3,569,797 A  3/1971  Simmons
4,125,777 A  11/1978  O'Brien et al.
4,267,559 A  5/1981  Johnson et al.
4,394,600 A  7/1983  Flannagan
4,631,805 A  12/1986  Olsen et al.
H000445 H  3/1988  Bock et al.
4,729,076 A  3/1988  Masami et al.

(Continued)

FOREIGN PATENT DOCUMENTS

JP  9-139513  5/1997

OTHER PUBLICATIONS

Cree Research, Inc., Spec. Sheet, "G-SIC® Technology Super Bright LEDs CXXX-CB290-E1000," revised May 1999, pp. 1-4.

(Continued)

*Primary Examiner*—Nathan W. Ha
(74) *Attorney, Agent, or Firm*—Price, Heneveld, Cooper, DeWitt & Litton, LLP

(57) ABSTRACT

A semiconductor optical radiation package includes a leadframe, at least one semiconductor optical radiation emitter, and an encapsulant. The leadframe has a heat extraction member, which supports the semiconductor optical emitter and provides one or more thermal paths for removing heat generated within the emitter to the ambient environment, as well as at least two electrical leads for providing electrical coupling to the semiconductor optical radiation emitter. The encapsulant covers and protects the emitter and optional wire bonds from damage and allows radiation to be emitted from the emitter into the ambient environment. The semiconductor optical radiation package provides high emitted flux and is preferably compatible with automated processing techniques.

156 Claims, 16 Drawing Sheets

U.S. PATENT DOCUMENTS

| | | | |
|---|---|---|---|
| 4,809,053 A | 2/1989 | Kuraishi | |
| 4,911,519 A | 3/1990 | Burton et al. | |
| 5,032,898 A | 7/1991 | Bowen et al. | |
| 5,055,892 A | 10/1991 | Gardner et al. | |
| 5,057,903 A | 10/1991 | Olla | |
| 5,060,027 A | 10/1991 | Hart et al. | |
| 5,113,232 A | 5/1992 | Itoh et al. | |
| 5,173,839 A | 12/1992 | Metz, Jr. | |
| 5,235,347 A | 8/1993 | Lee | |
| 5,291,039 A | 3/1994 | Ogata et al. | |
| 5,381,042 A | 1/1995 | Lerner et al. | |
| 5,434,750 A | 7/1995 | Rostoker et al. | |
| 5,442,234 A | 8/1995 | Liang | |
| 5,629,232 A | 5/1997 | Jiang | |
| 5,650,663 A | 7/1997 | Parthasarathi | |
| 5,656,823 A | 8/1997 | Kruangam | |
| 5,660,461 A | 8/1997 | Ignatius et al. | |
| 5,777,433 A | 7/1998 | Lester et al. | |
| 5,783,466 A | 7/1998 | Takahashi et al. | |
| 5,785,418 A | 7/1998 | Hochstein | |
| 5,789,772 A | 8/1998 | Jiang | |
| 5,808,325 A | 9/1998 | Webb | |
| 5,815,093 A | 9/1998 | Kikinis | |
| 5,825,794 A | 10/1998 | Ogino et al. | |
| 5,841,177 A | 11/1998 | Komoto et al. | |
| 5,857,767 A | 1/1999 | Hochstein | |
| 5,869,883 A | 2/1999 | Mehringer et al. | |
| 5,885,475 A | 3/1999 | Salyer | |
| 5,940,683 A | 8/1999 | Holm et al. | |
| 5,945,217 A | 8/1999 | Hanrahan | |
| 5,952,680 A | 9/1999 | Strite | |
| 5,958,100 A | 9/1999 | Farnworth et al. | |
| 5,959,316 A | 9/1999 | Lowery | |
| 5,966,393 A | 10/1999 | Hide et al. | |
| 5,998,925 A * | 12/1999 | Shimizu et al. | 313/503 |
| 6,045,240 A | 4/2000 | Hochstein | |
| 6,274,924 B1 | 8/2001 | Carey et al. | |
| 6,525,386 B1 | 2/2003 | Mills et al. | |

OTHER PUBLICATIONS

Opto Technology, Inc., "New Products-High Output Blue, Green, and Red LED Illuminators," www.optotech.com website, Copyright 1998.

Opto Technology, Inc. Spec Sheet, "High Power Red Illuminator," OTL680A-9-4-66-E, revised Jun. 1998.

Opto Technology, Inc. Spec Sheet, "High Power White Illuminator-Preliminary," OTLWHTA-9-4-66-E, revised Aug. 1999.

Opto Technology, Inc. Spec Sheet, "Very High Power IR Illuminator," OTL880B-9-4-66-E, revised May 1998.

Diemat Product Data Sheet, "DM6030Hk Ag Epoxy Adhesive Paste," May 11, 1999.

John K. Roberts (Gentex Corporation), "Binary Complementary Synthetic-White LED Illuminators," SAE Technical Paper Series, International Congress and Exposition, Detroit, Michigan, Mar. 1-4, 1999, pp. 1-17.

Hewlett-Packard, Inc., "LED Stop Lamps Help Reduce the Number and Severity of Automobile Accidents," Application Note 1155-3, Copyright 1998.

Hewlett-Packard, Inc., "SnapLED 70 LEDs," Preliminary Technical Data, Copyright 1999.

Hewlett-Packard, Inc., "Super Flux LEDs," Technical Data, Copyright 1998.

Hewlett-Packard, Inc., "Using Super Flux LEDs In Automotive Signal Lamps," Application Note 1149-1, 1999.

Epoxy Technology, "Products-Optical: Product Listing," www.epotek.com/optical_listing.html website, date unknow.

Advanced Thermoelectric Products, www.electracool.com/moduleworking.htm website—"The Basics," 1999.

Hewlett-Packard, Inc., "Thermal Management Considerations for Super Flux LEDs," Application Note 1149-4, date unknown.

Hewlett-Packard, Inc., "High-Flux LED," Technical Data, Copyright 1999.

* cited by examiner

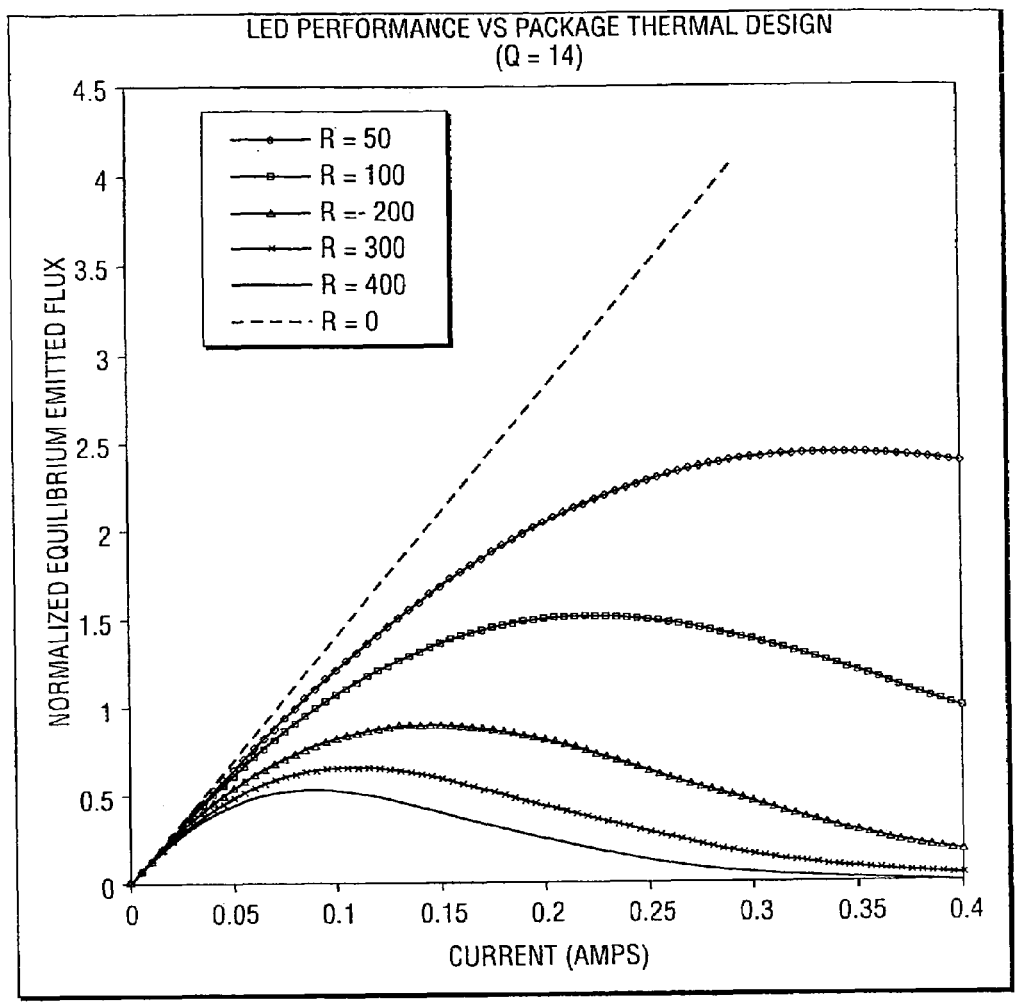
_Fig. 1_
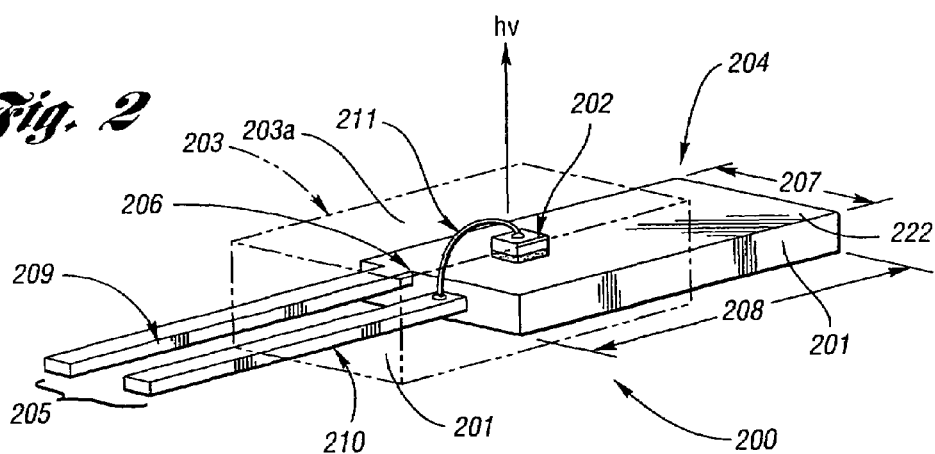
_Fig. 2_

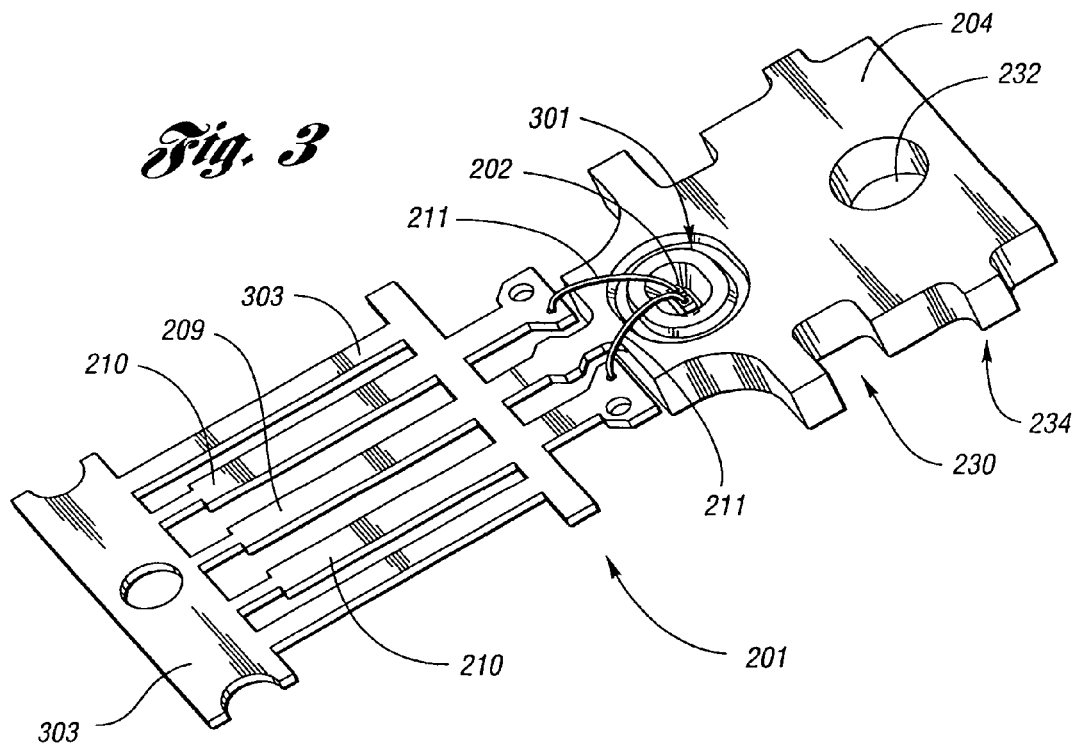
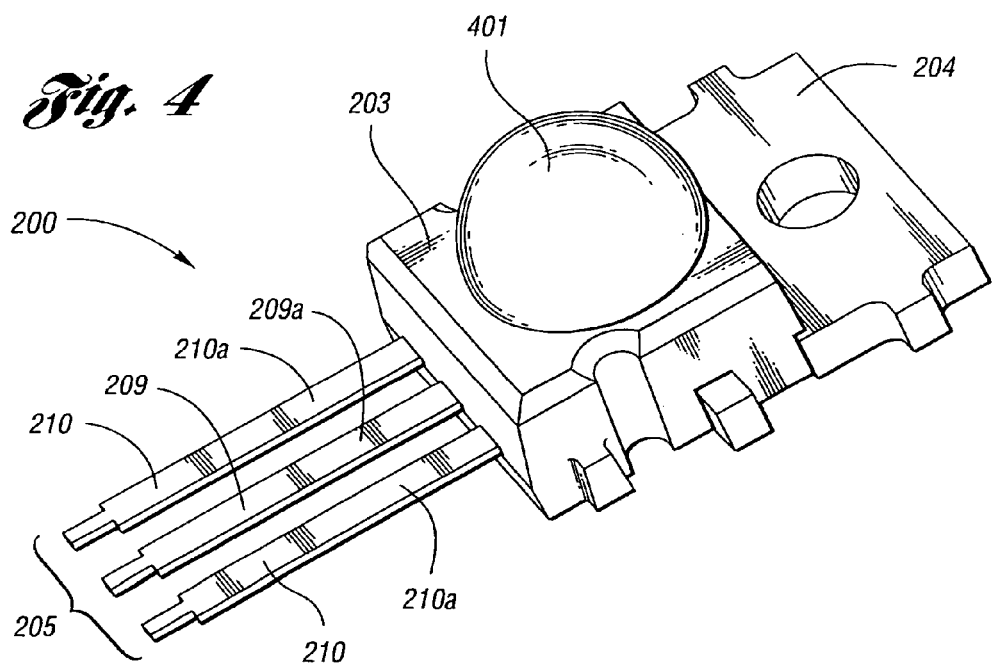

SEMICONDUCTOR RADIATION EMITTER PACKAGE

CROSS-REFERENCE TO RELATED APPLICATIONS

This application is a continuation of U.S. patent application Ser. No. 09/935,443 filed on Aug. 23, 2001, now U.S. Pat. No. 6,828,170, which is divisional application of U.S. patent application Ser. No. 09/426,795 filed on Oct. 22, 1999, now U.S. Pat. No. 6,335,548, which claims priority to U.S. Provisional Application No. 60/124,493 filed on Mar. 15, 1999. The entire disclosures of both of these applications are incorporated herein by reference.

BACKGROUND OF THE INVENTION

The present invention relates to semiconductor radiation emitter packages such as, for example, light emitting diode (LED) packages.

Semiconductor optical emitter components such as LED devices have become commonplace in a wide variety of consumer and industrial opto-electronic applications. Other types of semiconductor optical emitter components, including organic light emitting diodes (OLEDs), light emitting polymers (LEPs), and the like may also be packaged in discrete components suitable as substitutes for conventional inorganic LEDs in these applications.

Visible LED components of all colors are used alone or in small clusters as status indicators on such products as computer monitors, coffee makers, stereo receivers, CD players, VCRs, and the like. Such indicators are also found in a diversity of systems such as instrument panels in aircraft, trains, ships, cars, trucks, minivans and sport utility vehicles, etc. Addressable arrays containing hundreds or thousands of visible LED components are found in moving-message displays, such as those found in many airports and stock market trading centers, and also as high brightness, large-area outdoor TV screens found in many sports complexes and on some urban billboards.

Amber, red, and red-orange emitting visible LEDs are used in arrays of up to 100 components in visual signaling systems such as vehicle center high mounted stop lamps (CHMSLs), brake lamps, exterior turn signals and hazard flashers, exterior signaling mirrors, and for roadway construction hazard markers. Amber, red, and blue-green emitting visible LEDs are increasingly being used in much larger arrays of up to 300 components as stop/slow/go lights at urban and suburban intersections.

Multi-color combinations of pluralities of visible colored LEDs are being used as the source of projected white light for illumination in binary-complementary and ternary RGB illuminators. Such illuminators are useful as vehicle or aircraft maplights, for example, or as vehicle or aircraft reading or courtesy lights, cargo lights, license plate illuminators, backup lights, and exterior mirror puddle lights. Other pertinent uses include portable flashlights and other illuminator applications where rugged, compact, lightweight, high efficiency, long-life, low voltage sources of white illumination are needed. Phosphor-enhanced "white" LEDs may also be used in some of these instances as illuminators.

Infrared (IR) emitting LEDs are being used for remote control and communication in such devices as VCR, TV, CD, and other audio-visual remote control units. Similarly, high intensity IR-emitting LEDs are being used for communication between IRDA devices such as desktop, laptop and palmtop computers, PDAs (personal digital assistants), and computer peripherals such as printers, network adapters, pointing devices ("mice," trackballs, etc.), keyboards, and other computers. IR LED emitters and IR receivers also serve as sensors for proximity or presence in industrial control systems, for location or orientation within such opto-electronic devices such as pointing devices and optical encoders, and as read heads in such systems as barcode scanners. Blue, violet, and UV emitting LEDs and LED lasers are being used extensively for data storage and retrieval applications such as reading and writing to high-density optical storage disks.

Billions of LED components are used in applications such as those cited hereinabove, in part because relatively few standardized LED configurations prevail and due to the fact that these configurations are readily processed by the automated processing equipment used almost universally by the world's electronic assembly industries. Automated processing via mainstream equipment and procedures contributes to low capital cost, low defect rates, low labor cost, high throughput, high precision, high repeatability, and flexible manufacturing practices. Without these attributes, the use of LEDs becomes cost prohibitive or otherwise unattractive from a quality standpoint for most high-volume applications.

Two of the most important steps in modern electronic assembly processes are high-speed automated insertion and mass-automated soldering. Compatibility with automatic insertion or placement machines and one or more common mass-soldering process are critical to large-scale commercial viability of discrete semiconductor optical emitters (including LEDs).

Thus, the vast majority of LEDs used take the form of discrete-packaged THD (through-hole device) or SMD (surface mount device) components. These configurations primarily include radial-lead THD configurations known as "T-1" and "T-1 ¾" or similar devices with rectangular shapes, all of which are readily adapted onto tape-and-reel or tape-and-ammo packaging for convenient shipment, handling, and high speed automated insertion into printed circuit boards on radial inserters. Other common discrete THD LED packages include axial components such as the "polyLED" which are readily adapted onto tape and reel for convenient shipment, handling, and high speed automated insertion into printed circuit boards on axial inserters. Common SMD LED components such as the "TOPLED" and Pixar are similarly popular as they are readily adapted into blister-pack reels for convenient shipment, handling, and high-speed automated placement onto printed circuit boards with chip shooters.

Soldering is a process central to the manufacture of most conventional circuit assemblies using standardized discrete electronic devices, whether THD or SMD. By soldering the leads or contacts of a discrete electronic component such as an LED to a printed circuit board (PCB), the component becomes electrically connected to electrically conductive traces on the PCB and also to other proximal or remote electronic devices used for supplying power to, controlling or otherwise interacting electronically with the discrete electronic device. Soldering is generally accomplished by wave solder, IR reflow solder, convective IR reflow solder, vapor phase reflow solder, or hand soldering. Each of these approaches differ from one another, but they all produce substantially the same end effect—inexpensive electrical connection of discrete electronic devices to a printed circuit board by virtue of a metallic or inter-metallic bond. Wave and reflow solder processes are known for their ability to solder a huge number of discrete devices en masse, achieving very high throughput and low cost, along with superior solder bond quality and consistency.

Widely available cost-effective alternatives to wave solder and reflow solder processes for mass production do not presently exist. Hand soldering suffers from inconsistency and high cost. Mechanical connection schemes are expensive, bulky and generally ill-suited for large numbers of electrical connections in many circuits. Conductive adhesives, such as silver-laden epoxies, may be used to establish electrical connections on some circuit assemblies, but these materials are more costly and expensive to apply than solder. Spot soldering with lasers and other selective-solder techniques are highly specialized for specific configurations and applications and may disrupt flexible manufacturing procedures preferred in automated electronic circuit assembly operations. Thus, compatibility with wave solder or reflow solder processes are de facto requirements of an effective semiconductor optical emitter component. The impact of this requirement is far reaching because these solder operations can introduce large thermal stresses into an electronic component sufficient to degrade or destroy the component. Thus, an effective semiconductor optical emitter component must be constructed in such a fashion as to protect the device's encapsulation and encapsulated wire bonds, die-attach, and chip from transient heat exposure during soldering.

Conventional solder processes require that the ends of the leads of the device (below any standoff or at a point where the leads touch designated pads on the PCB) be heated to the melting point of the solder for a sustained period. This profile can include temperature excursions at the device leads as high as 230-300 degrees C. for as long as 15 seconds. Given that the leads of the device are normally constructed of plated metals or alloys, such as copper or steel, this high temperature transient poses no problems for the leads themselves. The problem instead is the ability of these leads to conduct heat along their length into the encapsulated body of the device. Since these heated leads are in contact with the interior of the body of the device, they temporarily raise the local internal temperature of the device during solder processing. This can harm the somewhat delicate encapsulation, encapsulated wire bonds, die-attach, and chip. This phenomenon represents one of the fundamental limitations of low-cost, opto-electronic semiconductor devices today.

Keeping the body of an electronic component from rising excessively above the glass transition temperature of its encapsulating material during solder processing is critical, since the coefficient of thermal expansion of polymer encapsulating materials rises dramatically above their glass transition points, typically by a factor of 2 or more. Polymers will increasingly soften, expand, and plastically deform above their glass transition points. This deformation from polymer phase transition and thermal expansion in encapsulants can generate mechanical stress and cumulative fatigue severe enough to damage a discrete semiconductor device, resulting in poor performance of the device and a latent predisposition to premature field failure. Such damage typically consists of: 1) fatigue or fracture of electrical wire bonds (at the chip bond pads or at the leadframe); 2) partial delamination or decomposition of die-attach adhesive; 3) micro-fracture of the chip itself; and 4) degradation of the device encapsulant, especially near the entry points of the leads into the encapsulant, and a compromised ability to seal out environmental water vapor, oxygen, or other damaging agents.

With regard to such thermal vulnerability, a crucial difference must be recognized between encapsulating materials suitable for non-optical electronic devices and those suitable for optical devices. The encapsulants used for non-optical devices may be opaque, whereas those used in constructing opto-electronic emitters and receivers must be substantially transparent in the operating wavelength band of the device. The side effects of this distinction are subtle and far ranging.

Since there is no need for transparency in non-optical devices, encapsulating materials for non-optical semiconductor devices may include a wide range of compositions containing a variety of opaque polymer binders, cross-linking agents, fillers, stabilizers, and the like. Compositions of this type, such as heavily filled epoxy, may possess high glass transition temperatures ($T_g$), low thermal expansion coefficients ($C_{te}$), and/or elevated thermal conductivity such that they are suitable for transient exposures up to 175 degrees C. Opaque ceramic compositions may be thermally stable up to several hundred degrees C. with no significant phase transition temperatures to worry about, extremely low $C_{te}$, and elevated thermal conductivity. For these reasons, exposure of conventional, opaque encapsulation materials for non-optical devices to electrical leads heated to 130 degrees C. or more for 10 seconds or so (by a solder wave at 230-300 degrees C.) is not normally a problem.

However, the need for optical transparency in encapsulants for opto-electronic emitters and receivers obviates use of most high-performance polymer-filler blends, ceramics, and composites that are suitable for non-optical semiconductors. Without the presence of inorganic fillers, cross-linking agents, or other opaque additives, the clear polymer materials used to encapsulate most opto-electronic devices are varieties of epoxies having low $T_g$ values, greater $C_{te}$, and low thermal conductivity. As such, they are not suitable for exposure to transient temperature extremes greater than about 130 degrees C.

To compensate for the potentially severe effects of damage from solder processing, prior art opto-electronic devices have undertaken a variety of improvements and compromises. The most notable improvement has been the relatively recent introduction of clear epoxies for encapsulation capable of enduring temperatures 10 to 20 degrees C. higher than those previously available (up to 130 degrees C. now versus the previous 110 degrees C.). While useful, this has only partially alleviated the problems noted—the newest materials in use still fall 50 degrees C. or more short of parity with conventional non-optical semiconductor encapsulation materials.

The most common compromise used to get around the transient temperature rise problem associated with soldering is to simply increase the thermal resistance of the electrical leads used in the device construction. By increasing the thermal resistance of these solderable leads, the heat transient experienced within the device body during soldering is minimized. Such an increase in thermal resistance can typically be accomplished in the following manner without appreciably affecting the electrical performance of the leads: 1) using a lead material with lower thermal conductivity (such as steel); 2) increasing the stand-off length of the leads (distance between solder contact and the device body); or 3) decreasing the cross-sectional area of the leads.

Using these three techniques, prior art devices have been implemented with elevated thermal resistance of the electrical leads to provide the desired protection from the solder process.

While effective at protecting prior art devices from thermal transients associated with soldering, there are limits to this approach, particularly in the application of high power semiconductor opto-electronic emitters. Increased lead thermal resistance results in elevated internal operating temperatures in prior art devices, severely compromising operational performance and reliability of these devices. The soldered electrical leads of most prior art LED devices conduct power to the device and serve as the primary thermal dissipation path for heat created within the device during operation. Thus, the electrical leads in prior art devices must be configured to possess thermal resistance as low as possible to facilitate heat extraction during normal operation. Radiation and natural convection from prior art devices play only a minor role in transferring internal heat to ambient, and thermal conduction through their encapsulating media is severely impeded by the low thermal conductivity of the optical materials used. Therefore, the electrically and thermally conductive metal leads must extract a majority of the heat to ambient by the mechanism of conduction. Greater thermal resistance in the solderable pins of these devices, necessary to protect the device from the transient thermal effects of soldering operations, therefore causes a higher internal temperature rise within the encapsulated device body during operation.

The maximum temperature rise of a portion of the device body in contact with the semiconductor emitter under steady state is approximately equal to the product of the power dissipation of the emitter and the thermal resistance between the emitter and the ambient environment.

As previously discussed, severe consequences will result if the device internal temperature rises substantially above the encapsulant $T_g$ value. Above this temperature, the $C_{te}$ of the encapsulant typically increases very rapidly, producing great thermo-mechanical stress and cumulative fatigue at the LED wirebond and attach. For most mobile applications, such as automobiles, aircraft and the like, ambient temperatures commonly reach 80 degrees C. With encapsulation maximum operating temperatures in the range of 130 degrees C., an opto-electronic emitter for these applications must therefore limit its operational ΔT to an absolute maximum of about 50 degrees C. This, in turn, limits the power that can be dissipated in a given component, and limits the current that may be passed through the component. Since the emitted flux of semiconductor optical emitters are typically proportional to the electrical current passed through them, limitations upon maximum electrical current also create limitations on flux generated.

Other fundamental properties of LEDs place further restrictions on the useful ΔT for operation. Semiconductor LEDs including IR, visible, and UV emitters emit light via the physical mechanism of electro-luminescence. Their emission is characteristic of the band gap of the materials from which they are composed and their quantum efficiency varies inversely with their internal temperature. An increase in LED chip temperature results in a corresponding decrease in their emission efficiency. This effect is quite significant for all common types of LEDs for visible, UV, and IR emission. Commonly, a 1 degree C. increase (ΔT) in chip temperature results in a 1% reduction in useful radiation and a 0.1 nm shift in the peak wavelength of the emission, assuming operation is at a constant power. Thus, a ΔT of 40 degrees C. will typically result in a 40% reduction in emitted flux and a 4 nm shift in peak wavelength. Considering the effects discussed hereinabove, LED performance as a function of package thermal design may be approximated by Equation 1:

$$\Phi_{Ta} = I \times e^{\beta \cdot R \cdot (a \cdot I^2 + b \cdot I)} \quad \text{(Equation 1)}$$

Where:
- $\Phi_{Ta}$ = Normalized LED Flux
- β = Coefficient for Change in LED emitted flux with respect to temperature (typically −0.011)
- I = the average current of the device at equilibrium
- R = the thermal resistance of the package
- a = Constant related to the equivalent series resistance of the emitter (ranging from 2.0-7.0, typically 5.5)
- b = Constant related to the minimum forward voltage of the emitter (ranging typically 1.2-5.0)

Equation 1 is illustrated in FIG. 1 for various power levels and package designs.

From the preceding discussion, it can be seen that to avoid thermal damage and achieve optimal LED emission performance, it is very important to minimize the ΔT experienced by the LED device chip and package during operation. This can only be achieved by limiting power or reducing thermal resistance.

Limiting LED power, of course, is antithetical to the purpose of high power LEDs, i.e., to produce more useful radiation. Generating higher flux with an LED generally requires higher current (and therefore higher power). Most prior art devices, however, exhibit relatively high thermal resistance from their semiconductor radiation emitter to ambient and are compelled to limit power dissipation in order to avoid internal damage. Thus, the best 5 mm T-1 ¾ THD packages are limited to about 110 mW continuous power dissipation at 25 degrees C. ambient temperature.

Other prior art devices have avoided these constraints, but have achieved high performance only by ignoring the needs of standardized, automated electronic assembly operations and adopting configurations incompatible with these processes. Still other prior art devices have achieved high performance by employing unusually expensive materials, sub-components, or processes in their own construction.

For example, one prior art approach that has been used to overcome these limitations uses hermetic semiconductor packaging, hybrid chip-on-board techniques, exotic materials such as ceramics, KOVAR and glass, or complex assemblies instead of or in addition to polymer encapsulation. While relevant for certain high-cost aerospace and telecommunications applications (where component cost is not a significant concern), such devices require expensive materials and unusual assembly processes. This results in high cost and restricted manufacturing capacity—both of which effectively preclude the use of such components in mass-market applications. The device disclosed in U.S. Pat. No. 4,267,559 issued to Johnson et al. illustrates a good example of this.

Johnson et al. discloses a device which includes both a TO-18 header component and a heat coupling means for mounting an LED chip thereto and transferring internally generated heat to external heat dissipating means. The header consists of several components including a KOVAR member, insulator sleeves and electrical posts, and is manufactured in a specialized process to ensure that the posts are electrically insulated as they pass through the header. The heat coupling means is a separate component from the header and is composed of copper, copper alloys, aluminum or other high thermal conductivity materials. According to the teachings of U.S. Pat. No. 4,267,559, the KOVAR header subassembly and copper heat coupling means must be bonded together with solder or electrically conductive adhesive for electrical continuity, allowing flow of electrical current into the heat coupling means and subsequently into the LED chip. Furthermore, the header and heat coupling means of U.S. Pat. No. 4,267,559 are made of completely dissimilar materials and must be so because of their unique roles in the described assembly. The header must be made of KOVAR in order that it may have a similar coefficient of thermal expansion to the insulator sleeves that run through it. At least one such sleeve is necessary to electrically isolate electrical pins from the header itself. However, KOVAR has relatively low thermal conductivity, necessitating the inclusion of a separate heat coupling means made of a material such as copper with a higher thermal conductivity. Since the header is a complex subassembly itself and is made of different materials than the heat coupling means, it must be made separately from the heat coupling means and then later attached to the heat coupling means with solder or an electrically-conductive adhesive.

LED devices made similar to those described in U.S. Pat. No. 4,267,559 are currently being marketed in specialized forms similar to a TO-66 package. These devices are complex and typically involve insulated pin and header construction, and/or include specialty sub-components such as ceramic isolation sheets within them.

Another approach which has been used to avoid damage to opto-electronic emitters from soldering has been to prohibit soldering of the component altogether or to otherwise require use of laser spot soldering or other unusual electrical attachment method. This can allow construction of a device with low thermal resistance from the semiconductor within to the electrical pins without danger of device damage from soldering operations. The SnapLED and Super SnapLED devices made by Hewlett Packard illustrate this approach. In these devices, electrical connections are made to circuitry by mechanically stamping the leads to a simple circuit rather than soldering. The resultant devices are capable of continuous power dissipation as high as 475 mW at room temperature. This configuration, however, may complicate integration of such components with electronic circuits having higher complexity—such circuits are conventionally made using printed circuit boards, automated insertion equipment, and wave or reflow solder operations.

A final approach is illustrated by an LED package called the SuperFlux package, available from Hewlett Packard. The SuperFlux device combines moderate thermal resistance between the encapsulated chip and the solder standoff on the pins with a high-grade optical encapsulant and specialized chip materials and optical design. It achieves a moderate power dissipation capability without resorting to a non-solderable configuration such as the SnapLED. However, there are several significant problems with this configuration that inhibit its broader use.

The package geometry of the SuperFlux package renders it incompatible with conventional high-speed THD radial or axial insertion machinery or by SMT chip shooters known to the present inventors. Instead, it must be either hand-placed or placed by expensive, slow, robotic odd-form insertion equipment. The SuperFlux package geometry is configured for use as an "end-on" source only—no readily apparent convenient lead-bend technique can convert this device into a 90-degree "side-looker" source. The moderate thermal resistance of the solderable pins of this device and relatively low heat capacity may leave it vulnerable to damage from poorly controlled solder processes. It may be inconvenient or costly for some electronic circuit manufacturers to control their soldering operations to the degree needed for this configuration. Finally, there is no convenient mechanism known to the inventors to outfit a SuperFlux package with a conventional active or passive heat sink.

A principal factor impeding further application of these and other LED devices in signaling, illumination, and display applications is that there is not currently available a device that has a high power capability with high emitted flux where the device is easily adaptable to automated insertion and/or mass soldering processes. These limitations have either impeded the practical use of LEDs in many applications requiring high flux emission, or they have mandated the use of arrays of many LED components to achieve desired flux emission.

Consequently, it is desirable to provide a semiconductor optical emitter device that combines high emission output with thermal protection during automated processing.

SUMMARY OF THE INVENTION

According to one embodiment of the present invention, a method of making a semiconductor radiation emitter package is provided that comprises the steps of: (a) forming a leadframe assembly from a sheet of electrically and thermally conductive material, the leadframe assembly having a heat extraction element and a plurality of thermally resistive leads, at least one tie-bar connecting at least one lead to another lead; (b) bonding at least one semiconductor radiation emitter to the heat extraction element, each emitter having a plurality of electrical connection points; (c) forming an electrical connection between at least one electrical connection point and at least one lead connected to the other lead by the at least one tie-bar; (d) encapsulating the at least one semiconductor radiation emitter with a material substantially transparent to wavelengths emitted by the at least one semiconductor radiation emitter; and (e) breaking each of the at least one tie-bar.

According to another embodiment, a method of making a plurality of semiconductor radiation emitter packages is provided that comprises the steps of: (a) forming a leadframe assembly from a sheet of electrically and thermally conductive material, the leadframe assembly having a plurality of leadframes each including a heat extraction element and a plurality of thermally resistive leads, the leadframe assembly further including a plurality of tie-bars connecting said plurality of leadframes to one another; (b) bonding at least one semiconductor radiation emitter to each heat extraction element, each emitter having a plurality of electrical connection points; (c) forming an electrical connection between at least one electrical connection point of said at least one said semiconductor radiation emitter and at least one of said plurality of leads of a corresponding one of said leadframes; and (d) encapsulating said at least one semiconductor radiation emitter with a material substantially transparent to wavelengths emitted by the at least one semiconductor radiation emitter so as to create a plurality of interconnected semiconductor radiation emitter packages.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 1 is a graph of current versus emitted flux for various theoretical package designs;

FIG. 2 is a generalized schematic diagram of a semiconductor optical radiation emitter package;

FIG. 3 is a drawing illustrating a semiconductor optical radiation emitter package without an encapsulant and prior to singulation;

FIG. 4 is a drawing illustrating an encapsulated and singulated package according to the embodiment of FIG. 3;

DETAILED DESCRIPTION OF THE PREFERRED EMBODIMENTS

Figure 5:
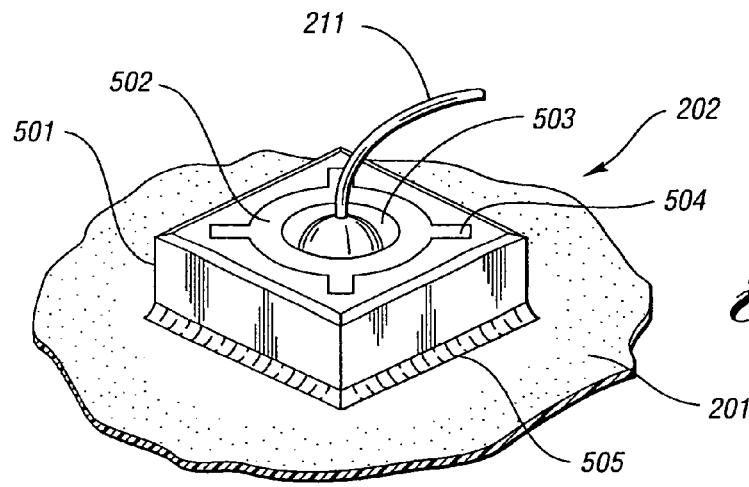
FIG. 5 is a perspective illustration of an emitter.

Referring initially to FIG. 2, a semiconductor optical radiation device or package 200 according to the present invention contains three major components: a leadframe 201, at least one semiconductor optical radiation emitter 202, and an encapsulant 203. Each of these components shall now be described in detail.

The leadframe 201 serves as a support for mounting a semiconductor optical radiation emitter 202, provides a mechanism for electrical connection to the semiconductor optical radiation emitter 202, and provides thermal paths for removing heat generated within the semiconductor optical radiation emitter 202 during operation and transferring this heat to adjacent media, adjacent structures, or the surrounding environment. The leadframe includes two primary elements: a heat extraction member 204 and a plurality of electrical leads, indicated collectively by 205.

The heat extraction member 204 consists of a thermally conductive body, typically composed of metal but potentially composed of a thermally conductive ceramic or other material that provides a dominant path (distinct from the leads 205) to transfer heat generated by the emitter of the device into the ambient environment. Preferably, the heat extraction member 204 functions to transfer more of the heat generated by the emitter out of the device into the ambient environment than is transferred by the electrical leads 205. Most preferably, the heat extraction member 204 is constructed to transfer more than 75% to 90% of this heat out of the device into the ambient environment, adjacent structures, or surrounding media. In contrast to the complex subassembly of Johnson et al., which includes a TO-18 header component, a heat coupling means, and electrical pins that protrude through the header, no complicated header component is needed in the semiconductor optical radiation package 200 according to the present invention. Another distinguishing feature is that the heat extraction member 204 transfers heat out of the encapsulation 203 to the ambient environment via a path having a location separate from the points of entry into the encapsulation of the electrical leads 205. Thus, the heat extraction member 204 forms the dominant thermal conduit to and from the semiconductor optical emitter 202 within the device 200, a conduit that is substantially independent of the electrical conduits to and from the device.

Broadly speaking, the heat extraction member 204 may range in thickness from 0.25 mm to 5.0 mm, in width (dimension 207) from 2 mm to 25 mm, and in length (dimension 208) from 2 mm to 25 mm. Preferably, the heat extraction member 204 is a modified rectangular solid approximately 1.0 to 2.0 mm thick, 9.5 to 12.0 mm wide (dimension 207), and 10.0 to 17.0 mm long (dimension 208). In another more preferred embodiment, the heat extraction member 204 is a modified rectangular solid approximately 1.625 mm thick, 11.0 mm wide (dimension 107), and 12.5 mm long (dimension 208). These dimensions ensure compatibility with standard auto-insertion equipment and standard mounting and heat-sink components. These ranges of dimensions yield a heat extraction member with a large cross-sectional area conducive to heat extraction.

As discussed in greater detail hereinbelow, the heat extraction member 204 may be constructed with a generally elliptical, circular or other non-rectangular form, and may be chamfered, or otherwise contain extensions, slots, holes, grooves and the like, and may incorporate depressions such as a collimating cup or other form to enhance optical performance. The heat extraction member 204 may be composed of copper, copper alloys such as beryllium copper, aluminum, steel, or other metal, or alternatively of another high thermal conductivity material such as ceramic. Suitable leadframe materials are available from a wide variety of sheet metal companies including Olin Brass of East Alton, Ill.

Figure 10:
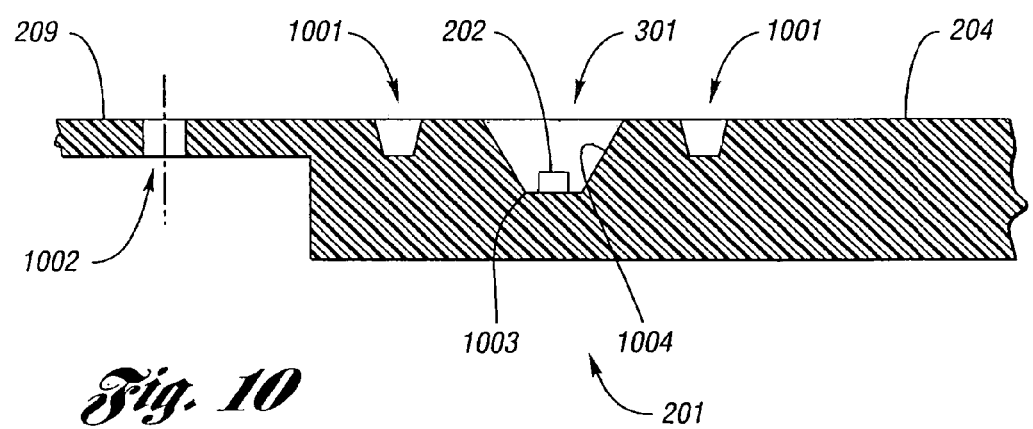
FIG. 10 is a cross-sectional drawing of a portion of a leadframe for use in a semiconductor optical radiation emitter package.
Figure 11:
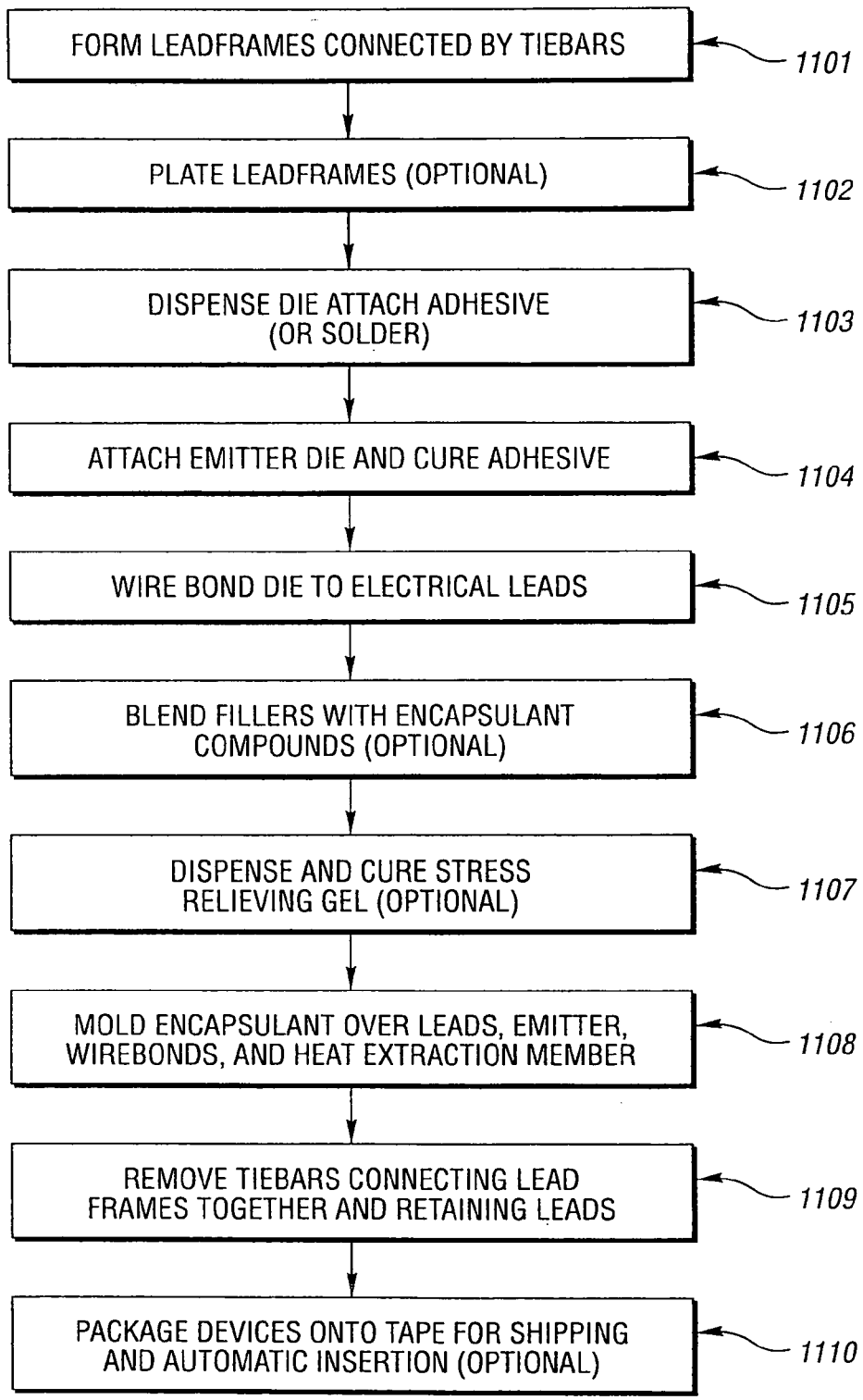
FIG. 11 is a flowchart illustrating the process for manufacturing a semiconductor optical radiation emitter package.

Portions of the surface of the heat extraction member 204 may be scored, textured, or embossed to enhance adhesion of the encapsulant of the component to the heat extraction member. The heat extraction member 204 is preferably plated to improve various physical properties of the base metal. Referring to FIG. 10, the region 1002 of the heat extraction member 204 directly underlying the point of attachment of the semiconductor optical radiation emitter 202 may be coated with nickel, palladium, gold, silver, or other materials including alloys in order to enhance the quality and reliability of the die-attach. Other thin-layered materials may be optionally inserted between the emitter and the heat extraction member to achieve a variety of desired effects without departing from the scope and spirit of the present invention. These materials may be adhesive, electrically insulative, conductive or a patterned composite of electrically insulative and conductive materials and, without significantly impeding thermal transfer, may be used to support, bond, electrically connect, or otherwise mount the emitter to the heat extraction member. The region 1004 of the heat extraction member 204 within any optical-enhancement cup feature 301 may be coated with silver, aluminum, gold, etc. to increase reflectance and improve the optical efficiency of the device. Referring again to FIG. 2, the region 222 of the heat extraction member 204 outside the encapsulant 203 may be coated with nichrome, black oxide, or other high emissivity treatment to improve radiative cooling. Other coatings may also be applied to various surfaces of the heat extraction member 204 to protect the device from environmental influences such as corrosion, or to improve adhesion of die-attach adhesives or encapsulants used within the semiconductor optical radiation package. Such coatings may be applied using a variety of anodizing, electro-plating, or other wet plating techniques and/or physical deposition methods such as E-beam evaporation, sputtering, and the like well known to those skilled in the art.

The heat extraction member 204 provides a primary path out of the package for heat generated by the semiconductor optical radiation emitter 202 to the ambient environment or to structures or media adjacent the package 200. To accomplish this, the heat extraction member 204 must exhibit a low thermal resistance between the surface region where it is attached to the semiconductor optical emitter 202 and the ambient environment or adjacent structures. The heat extraction member 204 accomplishes low thermal resistance to ambient or adjacent structures by a combination of one or more of the following attributes: 1) construction with substantially high thermal conductivity material such as copper, copper alloys such as beryllium copper, aluminum, soft steel, or other metal, or alternatively of another high thermal conductivity material such as ceramic; 2) construction with a substantially high cross-sectional area in one or more directions leading away from the surface region where the semiconductor optical emitter is attached; 3) construction with a relatively short path length in one or more direction from the surface region where the semiconductor optical emitter is attached to the ambient environment or adjacent structures; 4) construction with structural details such as fins or perforations or other features yielding a high surface area exposed to air, surrounding media, or adjacent structures (outside the device encapsulant) relative to device power to enhance convective and radiative heat loss; and 5) treatment of surfaces exposed to air, surrounding media or adjacent structures (outside the device encapsulant) with textures or coating materials having improved emissivity such as nichrome, black-oxide, or matte finish to enhance radiative heat loss by emission.

Another function of the heat extraction member 204 in some embodiments of the present invention is to dampen the effects of transient thermal exposure experienced by the device during soldering of the electrical leads 205. The heat extraction member 204 can accomplish this directly and indirectly. Direct dampening by the heat extraction member 204 of temperature extremes from soldering of electrical leads 205 is accomplished in embodiments of the present invention where the heat extraction member 204 is connected to or made integral with the one or more of the electrical leads 205 being soldered. Since the heat extraction member 204 is constructed with materials and geometry giving it a substantially high heat capacity, and the solderable electrical leads 205 are constructed with a relatively high thermal resistance between their standoff seating plane and the heat extraction member 204, temperature excursions caused by heat traveling up the electrical leads 205 during soldering are dampened. This function is analogous to that of an electrical "RC" filter for dampening voltage transients in an electrical circuit.

Indirect dampening of temperature extremes from soldering of electrical leads 205 is accomplished by the heat extraction member 204 by providing a dominant low thermal resistance path out of the device 200 which is substantially independent of the thermal path represented by the electrical leads. This allows the electrical leads 205 to be constructed with relatively high thermal resistance without compromising LED operational performance. Such a compromise exists in solderable prior art devices that rely on their electrical leads for supplying electrical current and for heat extraction. In the present invention, since the electrical leads 205 may be constructed with arbitrarily high thermal resistance without regard to their thermal impact during operation, the device can be very effectively protected against thermal transients travelling up the electrical leads 205 during soldering. Their high thermal resistance reduces the temperature extreme that would otherwise be reached within the device encapsulant 203 at and beyond the points where the electrical leads 205 enter the encapsulant 203. Additional functions of the heat extraction member 204 may include: 1) means of mechanically gripping or placing the device; 2) means for attaching or registering to adjacent components such as secondary optics, support members, or secondary heat extractors; 3) partial optical collimation or other beam reformation of energy emitted by the semiconductor optical emitter; and 4) partial mixing of energy emitted by a plurality of semiconductor optical emitters if a plurality is present.

To support these additional functions, additional characteristics may be required of the heat extraction member 204, some of which are illustrated in FIG. 3. Slots 230, through-holes 232, tabs 234, or standoffs (not shown) may be stamped directly into the metal of the heat extraction member 204 to facilitate handling by automated handling and placement in processing by mechanical grippers. Similar structural details may be incorporated for attachment of the device of the present invention to adjacent components. By attachment to a heat sink, housing, or other adjacent component or material, thermal extraction from the device may be further improved. Using similar features, secondary optical components may be readily snapped to or registered against devices of the present invention for superior optical performance and minimized variance.

By stamping a depression or cup 301 into the heat extraction member 204 and subsequently mounting semiconductor optical emitters 202 within this recess, the depressed surface of the heat extraction member 204 may serve as an optical collector and reflector, thereby improving optical performance of the device. The surface of the heat extraction member 204 surrounding the semiconductor optical emitter 202, including surfaces of an optical cup or depression 301 if present, may be coated with a highly reflective coating such as silver, aluminum, gold, etc. to enhance optical efficiency. Such stamping and coating features can also provide a narrower and more powerful beam and/or provide a more evenly distributed beam. The surface of the heat extraction member 204 surrounding the semiconductor optical emitter 202, including surfaces of an optical cup or depression 301, if present, may additionally or alternately be coated or textured so as to increase diffuse reflectance or scattering. In devices which contain more than one semiconductor optical radiation emitter 202, these treatments can also improve the mixing of energy within the beam resulting from the combined emissions of the plurality of emitters contained therein.

Referring again to FIG. 2, leadframe 201 contains a second primary element comprising a plurality of electrical leads referred to collectively as 205. For purposes of the present invention, electrical leads 205 refers to a metallic, electrical conductor component primarily configured for the purpose of establishing electrical connection between the semiconductor optical radiation emitter 202 and an external electrical circuit such as a power source (not shown). In addition to providing an electrical connection, the electrical leads 205 may serve as a method of mechanical retention to a circuit board, wire harness, connector or the like. Electrical leads 205 also provide a secondary thermal path out of the device, which is minor compared with the dominant thermal path defined by the heat extraction member 204. In fact, the minor thermal path formed by the leads 205 preferably possesses a high thermal resistance in order to isolate the device from thermal damage during soldering. Materials suitable for making electrical leads include copper, copper alloys such as beryllium copper, aluminum, steel, or other metals. These materials are available from a wide variety of sheet metal companies including Olin Brass of East Alton, Ill.

In a preferred embodiment of the present invention, one or more electrical leads 209 is made as a narrow integral extension of the heat extraction member 204. This is illustrated by the direct physical connection between lead 209 and heat extraction member 204 at point 206 in FIG. 2. This physical connection 206 may occur either within the perimeter of the encapsulant 203 or exterior to the encapsulant. In this fashion, the integral electrical lead 209 is electrically continuous with the heat extraction member 204 such that electrical current may be delivered through a short portion of the heat extraction member 204 from the integral electrical lead 209 to contact at the base surface of the semiconductor optical radiation emitter 202. The remaining one or more isolated electrical leads 210 is not connected to heat extraction member 204.

As discussed hereinabove, it is important in the present invention that the electrical leads 205 possess relatively high thermal resistance between portions of the integral electrical lead 209 exposed to solder and the semiconductor optical radiation emitter 202 within the device encapsulation. In some embodiments of the present invention, replacing integral electrical lead 209 with an isolated electrical lead electrically connected to the heat extraction member by a wire bond increases this thermal resistance. Electrical leads 205 are preferably made relatively low in a cross-sectional area to increase their thermal resistance, although the dimensions of the leads may vary depending on the final application of the device 200. Broadly speaking, the electrical leads 205 may be about ⅓ to ¼ the thickness of the heat extraction and may range in thickness from about 0.25 mm to 2.0 mm, in width from about 0.25 mm to 2.0 mm, and in length from about 2.0 mm to 25.0 mm. Presently preferred dimensions of electrical leads 205 are approximately 0.51 mm in thickness, approximately 0.87 mm in width (measured at the point that the leads exit the encapsulant 203), and approximately 9.0 mm in length (measured from the point that the leads exit the encapsulant to the standoff seating plane). This results in a cross-sectional area of 0.44 mm$^2$ for each lead and a relatively high thermal resistance, given the length of the leads and copper alloys used to make the leads. For comparison, the tab of the heat extraction member 204 in the configuration shown in FIG. 4 and according to the presently preferred dimensions would have a cross-sectional area of 17.875 mm$^2$ at the point where the tab exits the encapsulant 203. In a presently preferred embodiment, electrical leads 205 have a spacing of approximately 2.54 mm center to center to maintain standardization with many common electrical device configurations.

The thermal resistance of the electrical leads 205 may be further increased by constructing the electrical leads 205 from a low thermal conductivity metal and constructing the heat extraction member 204 from a high thermal conductivity metal. For example, the electrical leads 205 may be constructed from steel and the heat extraction member 204 may be constructed from copper. In this case, an integral electrical lead 209 made from steel can be made integral with a heat extraction member 204 made from copper. A method for accomplishing this heterogeneous construction is described hereinbelow.

For embodiments using a semiconductor radiation emitter 202 energized by a direct current (DC) power source, the electrical leads 205 are typically classified as anodic and cathodic electrical leads. A cathodic electrical lead refers to an electrical lead to be given a negative electrical potential (relative to an anodic electrical lead) upon electrical attachment to an external electrical circuit or connector. Similarly, an anodic electrical lead refers to an electrical lead to be given a positive electrical potential (relative to a cathodic electrical lead) upon attachment to an external electrical circuit or connector. Semiconductor radiation emitter packages 200 of the present invention will normally include at least one anodic and at least one cathodic electrical lead.

If one of the electrical leads 205 of an embodiment is an integral electrical lead 209, and the semiconductor radiation emitter 202 is of the type including an electrical contact at its base, then the polarity of this lead 209 is typically configured to match that of the contact at the base of the semiconductor radiation emitter 202. In this case, at least one isolated electrical lead 210 with electrical polarity opposite of that of the integral electrical lead 209 is included in the package and is electrically connected to the top bond pad of the semiconductor radiation emitter 202 via a wire bond 211. This integral electrical lead 209 may thus be a cathodic or anodic lead electrically connected to the base of the semiconductor radiation emitter 202, depending on whether the semiconductor radiation emitter has a cathode or anode contact at its base, respectively. The isolated electrical lead 210 similarly may be an anodic or a cathodic lead electrically connected to the top bond pad of the semiconductor radiation emitter 202, depending on whether the semiconductor radiation emitter has an anode or cathode contact at its top bond pad, respectively.

As is illustrated in FIG. 3, the present invention can be adapted to contain a plurality of semiconductor radiation emitters 202. In a preferred embodiment, two semiconductor optical radiation emitters are present and mounted in a cup 301 formed in heat extraction member 204. These two semiconductor optical radiation emitters both contain a cathodic contact on their base that is electrically connected to the heat extraction member 204. A single integral cathodic electrical lead 209 provides an electrical path to both semiconductor optical radiation emitters 202. Two separate isolated anodic electrical leads 210 provide an isolated anodic electrical path to each of semiconductor radiation emitters. As described above, wire bonds 302 provide electrical connection from the anodic electrical lead to each of the semiconductor radiation emitters 202. The use of two isolated anodic electrical leads 210 facilitates the use of two different semiconductor optical radiation emitters 202 by providing connection for an independent current supply for each emitter. In the event that each of the semiconductor radiation emitters 202 is of substantially the same configuration, a common anodic electrical lead may be used in addition to a common cathodic lead. Also, the invention can be modified to include more than two or three electrical leads to provide for more than two semiconductor radiation emitters of a variety of configurations.

Referring to FIG. 4, in a preferred embodiment, the electrical leads 205 are all formed to be parallel to one another and contained substantially in the same plane or in parallel planes. As illustrated in FIG. 4, the plane of an electrical lead 205 is defined as the plane containing the top surface (209a and 210a) of the electrical lead at the point where the electrical lead exits the encapsulant 203, or alternatively the point where the wire bond is made to the lead, if the lead is bent prior to exiting the encapsulant. The top surface of the electrical lead 205 is defined as the surface perpendicular to and facing the primary direction of radiation emission from the semiconductor optical radiation emitter 202. In this embodiment, wire bond attachments to isolated electrical leads 205 occur on the top surface of the electrical leads. The plane of the heat extraction member 204 is defined as the plane containing the surface onto which the semiconductor optical radiation emitter(s) 202 is bonded. As shown in FIG. 3, the plane of each electrical lead 205 is substantially parallel to the plane of the heat extraction member 204 in this embodiment. Although electrical leads 205 are shown and described thus far as having a rectangular cross section, it should be understood that leads with a circular cross section, varying cross section, or other cross section shape are still within the scope and spirit of the present invention so long as there is a feature of the lead appropriate for connection of a wire bond 302 when needed.

Isolated electrical leads 210 are positioned external to the outer perimeter of the heat extraction member 204 and do not pass through the heat extraction member. The positioning of the isolated electrical leads 210 outside the outer perimeter of the heat extraction member 204 eliminates the need for insulating sleeves, bushings, and the like which are required for some prior art devices where electrical leads may penetrate through a heat extractor and thus must be electrically insulated from this extractor. Eliminating such an insulating bushing, sleeve, or the like reduces the number of components in the present invention relative to these prior art devices and thus may facilitate a more simple and cost effective manufacturing process than previously achievable for a high power LED device of comparable performance.

In a preferred embodiment shown schematically in FIG. 2 and pictorially in FIG. 4, electrical leads 205 extend out of one surface of the encapsulant 203 and heat extraction member 204 extends out of the opposite surface of the encapsulant. The heat extraction member 204 may also be exposed solely or additionally through the bottom surface (surface opposite the primary direction of optical radiation emission) of the encapsulant 203.

Electrical leads 205 may be straight or bent at various angles. Various lead bend options allow the use of the present invention in either end-looker or side-looker configurations. An end-looker configuration is defined as a configuration in which the primary direction of optical radiation is generally parallel to the axis of one or more electrical leads 205 at the point where the electrical leads make contact to a circuit board, connector, or the like. This is in contrast to a side-looker configuration wherein the primary direction of radiation is generally perpendicular to the axis of one or more electrical leads at the contact point to external media. Configuring electrical leads 205 to extend straight from a side of the encapsulant 203 allows use of the device in a side-looker configuration. Various applications may require the use of the device in side-looker or end-looker configurations or at angles between. A very useful aspect of the present invention is the ability to easily adapt the leadframe 201 to either configuration by a simple lead bend operation. Electrical leads 205 may contain various features to aid in the manufacture of systems containing the present invention. For example, electrical leads 205 may contain standoffs to aid in the registration of the leadframe 201 onto a printed circuit board. These standoffs may be bent to be perpendicular to the plane of the electrical leads to prevent the leadframe from tipping relative to a printed circuit board.

Various lead bend, form, trim, and stamping options allow the leadframe in the present invention to be applied in a wide range of configurations including end-looker, side-looker, through-hole, surface-mount, connector-attach, or the like. Several examples of adaptations of the leadframe to these various configurations will be presented later in this disclosure.

All or portions of electrical leads 205 may be plated or coated with a variety of materials to enhance various physical properties of functions of the leads. Commonly, the portion of these leads external to the component encapsulation 203 will be plated or coated with nickel, silver, gold, aluminum, metallic alloys and/or solder to improve resistance of the leads to corrosion and to improve the solderability of the leads of the finished component. Portions of the leads 205 internal to the component encapsulation 203 are commonly coated with these or other materials to improve wire-bond properties of surfaces of the leads where a wire-bond is made.

For purposes of the present invention, semiconductor optical radiation emitters 202 comprise any component or material that emits electromagnetic radiation having a wavelength between 100 nm and 2000 nm by the physical mechanism of electro-luminescence upon passage of electrical current through the component or material. The principal function of a semiconductor optical emitter 202 within the present invention is the conversion of conducted electrical power to radiated optical power. A semiconductor optical radiation emitter 202 may include a typical infrared, visible, or ultraviolet LED chip or die well known in the art and used in a wide variety of prior art devices.

Alternate forms of semiconductor optical emitters which may be used in the present invention are LEPs, polymer light emitting diodes (PLEDs), OLEDs and the like. Such materials and opto-electronic structures made from them are electrically similar to traditional inorganic LEDs, but rely on organic compositions such as derivatives of the conductive polymer polyaniline for electroluminescence. Such semiconductor optical emitters are relatively new, but may be obtained from sources such as Cambridge Display Technology, Ltd. of Cambridge, and from Uniax of Santa Barbara, Calif. If such materials are included in a binder and disposed directly onto the surface of the heat extraction member, then an attachment material may be unnecessary for electrical connection, thermal conductivity, or mechanical retention between the LEP semiconductor optical emitter and the heat extraction member.

For brevity, the term "semiconductor optical radiation emitter" may be substituted with the term LED or the alternate forms of emitters described above or known in the art. Examples of emitters suitable for the present invention include varieties of LED chips with associated conductive vias and pads for electrical attachment and that are emissive principally at P-N junctions within doped inorganic compounds of AlGaAs, AlInGaP, GaAs, GaP, InGaN, GaN, SiC, and the like. Other varieties of LED chips included within the scope of the present invention include those whose emissions are enhanced via the physical mechanism of fluorescence by use of an organic or inorganic dye or phosphor.

Representative LED chips are used within the wide variety of discrete prior art LED devices (SMD and THD) and hybrid LED arrays in widespread usage worldwide. Regardless of the semiconductor materials used, all LED chips suitable for the present invention provide means to electrically connect to either side of the junction responsible for optical emission. Referring to FIG. 5, such means usually take the form of a metallized bond pad 502 for one electrode on the topmost face of the chip and a conductive base for the other electrode. Commonly, the metallized bond pad 502 is an anode optimized for electrically continuous connection to a metallic anode wire by means of a ball wirebond 503 and 211. The conductive base of many LED chips is commonly the cathode, optimized for electrically continuous connection to a leadframe 201 by means of a die-attach 505. In some types of LEDs, the polarity is reversed such that the top bond pad 502 is the cathode and the conductive base is the anode. In another configuration, the topmost surface of the LED chip possesses two bondpads, and electrical connection to both the LED anode and cathode is made by wirebond 211.

LED chips suitable for use in the present invention are made by companies such as Hewlett-Packard, Nichia Chemical, Siemens Optoelectronics, Sharp, Stanley, Toshiba, Lite-On, Cree Research, Toyoda Gosei, Showa Denko, Tyntec, and others. For normal operation, such chips are typically fashioned approximately in a tapered cubic shape having a square base between 0.008" and 0.016" long on each side, a height of about 0.008" to 0.020", and a taper angle of less than 15 degrees. In some embodiments of the present invention, however, larger chips (having a square base up to 0.025" long on each side) are used to achieve various effects.

Figure 6:
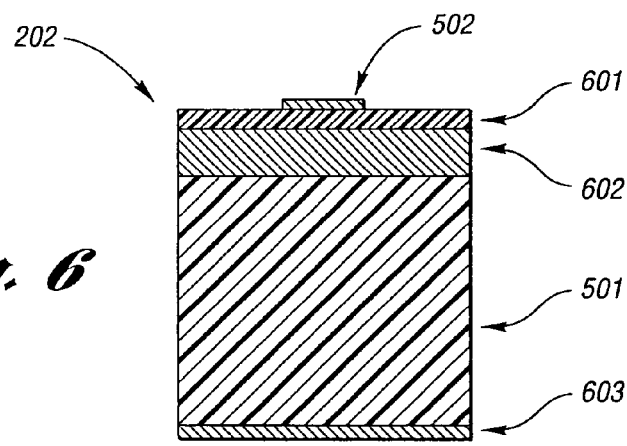
FIG. 6 is a cross-sectional illustration of an emitter.

FIG. 6 is a simplified diagram of a typical LED chip 202 construction suitable for use in the present invention. LED chip 202 contains a top electrode bonding pad 502 which is typically a circular metallized region about 0.1 mm to 0.15 mm in diameter centered on the top of the chip and suitable for attachment of a wire bond. However, the use of larger chips in some embodiments of the present invention may require bonding pads 502 as large as 0.3 mm in diameter. The metalization of such a pad typically comprises one or more layers of aluminum, silver, gold, ITO, alloys of these metals, or other conductive materials deposited onto the parent wafer of the chip in a vacuum physical vapor deposition process such as electron beam evaporation, ion-assisted deposition, ion-plating, magnetron sputtering, and the like. Finally, a plurality of redundant bond pads may be positioned across the chip with multiple wire bond connections to them. This configuration has the advantage of providing redundant connection and decreases the probability of catastrophic failure in the event of a wire bond break. However, the presence of multiple bond pads reduces the surface emission area of the chip making this technique appealing only for larger LED chips. As depicted in FIG. 5, bond pad 502 may contain extensions 504 for the purpose of improving the distribution of the current across the top surface of the chip 202. These extensions may be in a variety of patterns, such as honeycomb, grid, asterisk, etc.

Optional current spreading layer 601 located under bonding pad 502 or coplanar with bonding pad 502 functions to distribute the flow of current through the die and provide uniform current density through the P-N junction. Current spreading layer 601 may be composed of a transparent conductive layer, such as ITO.

Emission layer 602 represents the active junction region from which optical emission occurs. The emission layer may include one or more P- or N-doped semiconductor layers forming one more P-N junctions. The emission layer 602 may contain one or more differing semiconductors as is the case in a heterojunction device, or may contain a superlattice structure.

In another common construction, the P-N junction is formed between a doped semiconductor layer 602 and a doped substrate 501. In this case, emission occurs not only from layer 602 but from a combination of layer 602 and the substrate 501; specifically from a depletion region formed surrounding the junction of layer 602 and substrate 501. Layer 602 may be N-doped with substrate 501 being P-doped or vice versa. As before, this construction may be combined with additional doped semiconductor layers to form additional homojunctions or heterojunctions.

Substrate 501 is typically a doped, conductive, semiconductor substrate suitable for the epitaxial growth of emission layer 602. Substrate 501 may be opaque or transparent. Substrate 501 may be formed from semiconductor materials which are substantially the same or similar to those used to form the emission layer 602. In other configurations, the substrate 501 is composed of a material substantially different from the material of emission layer 602, in which case an intermediate buffering material may be placed between the emission layer 602 and the substrate 501. The emission layer 602 is not always epitaxially grown on the substrate 501, and in certain known configurations, the emission layer 602 is formed separate from the substrate 501 and later bonded to the substrate 501 using wafer bonding techniques. An optional metal coating 603 is typically formed on the back of the substrate 501 to improve contact consistency, improve stability, create ohmic contact, and reduce electrical resistance.

In some cases, the substrate 501 is non-conductive, for example, in InGaN LED chips formed on a sapphire substrate. In this situation, two bonding pads 502 are present on the top of the LED chip 202, one of which is constructed to form electrical contact with the back of the emission layer 602 and the other constructed to form electrical contact with the top.

Many variations of the above constructions are known to those skilled in the art. LED chips incorporating additional features such as integral reflectors and light extraction surface treatments have been disclosed. Chips of varying size and different geometrical configurations are also known. The present invention is not intended to be limited to any particular construction or family of construction of LED chips.

Increasing the width and length of the chip 202 may reduce the current density flowing through the chip, allowing more total current to be passed when desired. More current generally allows for greater flux emission, a desired trait for high power LEDs. Increasing the base area of the LED chip 202 also increases the contact area of the adhesive or solder bond 505 between the chip and the leadframe 201. This reduces the thermal resistance of this boundary and allows the chip to maintain a cooler operating temperature for a given power dissipation (or alternately to maintain an equivalent operating temperature at higher power dissipation or higher ambient temperatures). As discussed hereinabove, lower operation temperature is critical to maintaining high emitted flux and component reliability.

Increasing the base area of the LED chip 202 also increases the area of adhesion in the adhesive or solder bond between the LED chip and the heat extraction member 204. Such a larger bond area is stronger and more resistant to transient thermo-mechanical stress and accumulated fatigue from repeated thermo-mechanically induced stresses. Finally, increasing the base area of the LED chip 202 and the attendant contact area of the adhesive or solder bond 505 between the chip 202 and the heat extraction member 204 may also reduce the electrical resistance of the bond between the LED chip 202 and the heat extraction member 204. This is important for those LED chips constructed with cathodic or anodic contacts at the base surface. Reduced contact resistance through such base electrodes reduces excess ohmic power dissipation in the electrically conductive bond at elevated current levels. This allows the chip to maintain a cooler operating temperature for a given power dissipation (or alternately to maintain an equivalent operating temperature at higher power dissipation or higher ambient temperatures).

Reducing the chip substrate 501 thickness can increase the performance of an LED chip when used in a high power device such as the present invention. Normal LED chips range in thickness from 0.010" to 0.012". Decreasing chip substrate 501 thickness to possibly as thin as 0.006" or less reduces the electrical resistance through the substrate 501 and thereby reduces the ohmic heating of the substrate caused by current flowing from a base electrode contact to the emission layer 602. This results in reduced power dissipation, a lower junction temperature for a given operating current, and thus increased operating efficiency. Additionally, decreasing the thickness of substrate 501 reduces the thermal resistance between the emission layer 602 and the heat extraction member 204 to which the LED chip 202 is bonded, and thus improves the extraction of heat from the junction and improves the efficiency of this device. This is of particular relevance for chips constructed with rather high thermal resistance substrate materials such as GaAs.

Electrical connection to top-side anode or cathode bond pads is normally made by a wire bond 211 that establishes electrical continuity between the top side electrode and an electrical lead 205, as well known in the art and described hereinafter. In alternate embodiments described hereinafter, this top-side wire bond 211 may be made in a chain fashion to the anode or cathode of another of a plurality of LED chips situated within a single LED device of the present invention. The wire bond 211 is of typical construction well known in the prior art LED devices, with the exception of size in the highest power embodiments.

Wire bond 211 is included in most typical embodiments of the invention where the anode, cathode, or both electrodes of an LED chip 202 consist of a metallized bond pad 502 on the top of the chip. As described hereinbefore, the primary function of a wire bond 211 in the present invention is to establish electrical contact between an LED electrode and an appropriate electrical lead 205. The wire bond 211 and bond pad 502 must collectively establish a low electrical resistance path through which all of the current supplied to typical LED chips must flow. The wire used for wire bonding in the present invention is typically constructed of gold, aluminum, or alloys thereof with a diameter typically between 0.04 mm and 0.3 mm. Suitable wire for wire bonding is available from American Fine Wire, a division of Kulicke and Soffa Industries of Philadelphia, Pa.

Electrical connection is normally made between the wire bond member 211 and a top-side bond pad 502 on an LED chip 202 using a thermo-sonic or ultrasonic ball-bond as is well known in the art; however, in some circumstances, a wedge or stitch bond may be preferred. Electrical connection at the other end of the wire bond member 211 is established to a portion of an electrical lead 205, to the heat extraction member 204, or alternatively to a top-side bond pad 502 of an adjacent LED chip within the device. Bonds made to electrical leads 205 or to the heat extraction member 204 are normally wedge or stitch bonds.

The most common means of attachment of an LED chip 202 to the heat extraction member 204 is by the use of a special type of electrically conductive adhesive die-attach epoxy. These adhesives normally achieve good electrical conductivity by inclusion of metallic fillers, such as silver, in the adhesive. Suitable die-attach adhesives are well known in the art and may be obtained from Quantum Materials of San Diego, Calif., from Ablestik division of National Starch and Chemical, and EpoTek of Billerica, Mass. As an alternative to electrically conductive adhesive, solder may be used as a means of attaching the LED chip 202 to the heat extraction member 204 in some embodiments.

Whether the LED chip 202 is attached with electrically conductive adhesive or solder, the bond establishes good electrical and thermal conductivity between the LED chip 202 and the heat extraction member 204. This facilitates the flow of electrical current from a base cathode of the LED chip through a portion of the heat extraction member 204 to or toward a cathodic electrical lead (or to an electrical wire conductor leading thereto). The die-attach or solder bond 505 also retains the LED chip 202 in a registered fashion relative to any optical features made integral with either the heat extraction member 204 or the device encapsulation 203.

In the case of LED chips 202 with two top electrodes such as those operating on InGaN and GaN architectures on sapphire substrates, however, the die-attach 505 serves only two primary functions—thermal coupling and structural retention or registration as described above. This is because both of the electrodes (anode and cathode) of such chips are manifest as conductive bond pads 502 at the top of these LED chips 202 rather than at their base, such that electrical attachment is achieved by means of a wire bond 211 instead of a die-attach 505. In this situation, the attachment material may be electrically conductive (for the sake of process standardization and convenience), but such electrical conductivity is not necessary for proper function of the device.

It should be noted that it is possible to construct LED chips 202 with electrical polarity that is reversed relative to the location of the anode and cathode connections. Such chips look substantially the same as conventional LED chips, with a bond pad 502 situated on the top surface and an electrical contact coextensive with their base surface. Such chips may be used in the present invention; however, care must be exercised to ensure proper polarity of electrical potential supplied to the device when placed in circuit.

An alternative construction of an LED chip has recently been introduced that is known as a flip-chip LED. A flip-chip LED possesses an unusual internal and surface architecture such that both the anode and cathode are fashioned as isolated, metallized contacts disposed upon the base and or portions of the sides of the LED chip. Establishing electrical contact to both electrodes on such flip-chip LED chips is achieved by conductive die-attach adhesive or by solder—no wire bonds are necessary (or feasible for that matter). To utilize a flip-chip LED in the present invention, an additional isolation layer, such as a patterned metallized ceramic member, may be used between the flip-chip and the heat extraction member to ensure electrical isolation between the LED anode and cathode. While this does add complexity and cost to a device and may slightly compromise the otherwise superior thermal performance of the present invention, it may be desired in certain embodiments. Despite the likely compromise in emission efficacy attending this flip-chip adaptation, a flip-chip embodiment of the present invention would contain no wire-bonds and might therefore be capable of more extended operation in certain environments of extreme temperature cycling.

A flip-chip adapter for use in the present invention consists of a small and thin, thermally conducting, electrically-insulating substrate upon which two electrically-isolated, electrically-conductive bond pads are disposed. The flip-chip adapter serves several functions: 1) support a flip-chip LED; 2) provide means for electrical connection to the flip-chip anode and cathode contacts; 3) maintain electrical isolation between flip-chip anode and cathode contacts upon attachment of the flip-chip LED to the adapter and of the adapter to the heat extraction member; and 4) provide an efficient thermal path between the flip chip LED and the heat extraction member.

With understanding of the possible configurations of the semiconductor optical radiation emitter(s) 202 and the potential configurations of electrical leads 205 and heat extraction member 204, several electrical configurations become possible. Several potential configurations will be described in the following paragraphs.

Figure 7A:
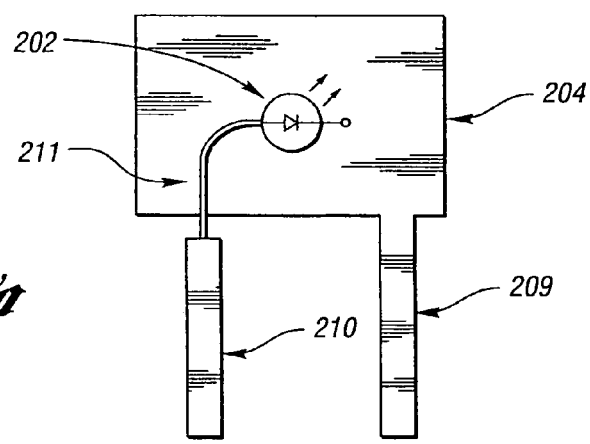
FIGS. 7a-7c are schematic diagrams of various emitter electrical configurations.

FIG. 7a schematically shows a single emitter electrical configuration. The semiconductor optical radiation emitter 202 is an LED chip mounted to the heat extraction member 204. In this embodiment, cathode contact is made through the base of the LED chip to the heat extraction emitter. An integral cathode electrical lead 209 provides cathode electrical path to external circuitry. The LED chip 202 has an anode bonding pad at the top of the chip which is wire bonded 211 to an isolated anode electrical lead 210 providing an anode electrical path.

Figure 7B:
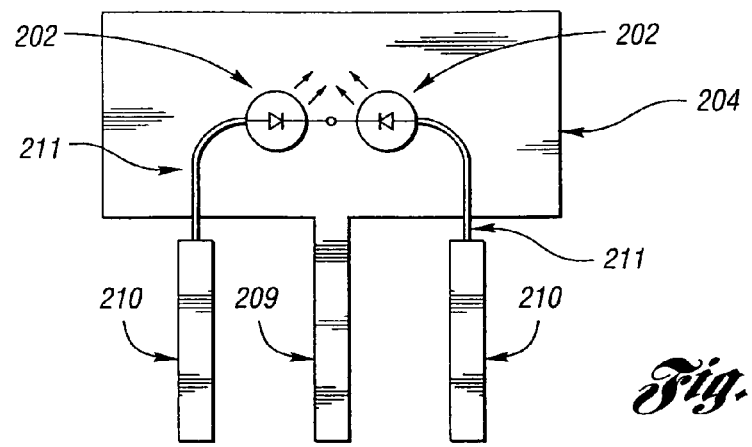

FIG. 7b illustrates schematically an embodiment containing two semiconductor optical radiation emitters 202 which are LED chips with cathode contact on the base of the chip. The chips 202 are mounted to the heat extraction member 204 with a common cathode contact. Integral cathode electrical lead 209 forms the cathode electrical path for both chips 202. Anode connection to each of the chips 202 is formed through wire bonds 211 to separate isolated electrical leads 210. LED chips 202 may be of the same or substantially different types. The isolation of the first and second anode electrical leads 210 allows independent control of the current flowing through each of the chips 202.

The configuration in FIG. 7b can be slightly modified to facilitate the use of LED chips which do not have a cathode electrical contact on the back of the chip but rather possess both anode and cathode bonding pads on their top surface. Such is the case with the common InGaN on sapphire construction for blue and green emitting LEDs. In the event that either or both of LED chips 202 are constructed in this way, an additional bonding wire can be provided to connect the cathode bonding pad on the top of the chip to the heat extraction member 204 or the integral cathode electrical lead 209. The use of more than two chips 202 is facilitated by the addition of more isolated anodic electrical leads 210.

Figure 7C:
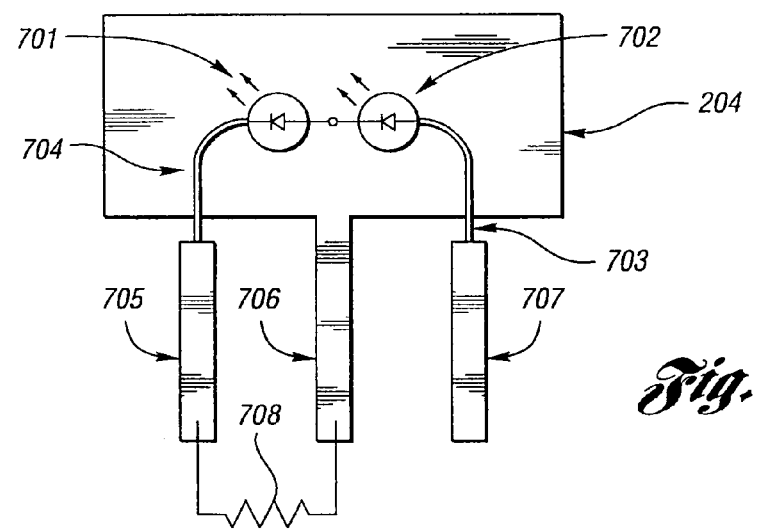

An example of LED chips connected in series is shown is FIG. 7c. In this example, a first LED chip 701 is configured with a cathode connection made through its base and an anode connection made through a bonding pad at its top surface. Second LED chip 702 is configured with an anode connection made through its base and the cathode connection made with a bonding pad on the top surface of the chip. LEDs 701 and 702 are connected to the heat extraction member 204 with a conductive epoxy or solder. In this way, the cathode of LED chip 701 is electrically connected to the anode of LED chip 702, both of which are electrically connected through the heat extraction member 204 to an integral electrical lead 706. The anode bonding pad of LED chip 702 is connected to an isolated anode electrical lead 707 through wire bond 703. The cathode of LED chip 701 is electrically connected to isolated cathode electrical lead 705 through wire bond 704. Optional shunt resistor 708 may be provided by external circuitry to reduce the current through LED chip 701 relative to LED chip 702. Further external circuitry to control the current being supplied to two or more LEDs is outlined in U.S. Pat. No. 6,441,943 filed on Oct. 22, 1999, on behalf of John K. Roberts et al., which is hereby incorporated herein in its entirety by reference.

In another embodiment, it may be beneficial to electrically isolate the heat extraction member 204 from one or more of the LEDs 202 in the package 200. To accomplish this, an additional isolation layer, such as a patterned metallized ceramic member, may be used between the LED(s) and the heat extraction member to ensure electrical isolation. This may be useful in applications where several devices are used in series and mounted on a common metallic heat sink. In this embodiment, all electrical leads would be isolated from the heat extraction member. Anodic and cathodic connections to the isolated electrical leads can be made via wire bonds to the top of the die. In the case where electrical contact is made with the base of the LED, the insulating substrate can be metallized and a die-attach can be used to make electrical contact with the base and a wire bond can be used to make connection between an isolated electrical lead and the metallization on the insulating substrate.

In several applications, it may be useful to provide current to the LEDs through a fixed voltage supply without the use of external ballast resistors electrically in series with the LED chips. The large area of the heat extraction member will allow for the mounting of a chip resistor onto the substrate. For example, the resistor can be placed in series with the LED chip and the anodic isolated electrical lead in order to provide an internal current limiting mechanism.

An encapsulant is a material or combination of materials that serves primarily to cover and protect the semiconductor optical radiation emitter 202 and wire bonds 211. To be useful, at least a portion of encapsulant 203 must be transparent or translucent to the wavelengths of optical radiation emitted by the semiconductor optical radiation emitter 202. For purposes of the present invention, a substantially transparent encapsulant refers to a material that, in a flat thickness of 0.5 mm, exhibits greater than 10% total transmittance at any wavelength of energy between 100 nm and 2000 nm emitted by the one or more semiconductor optical radiation emitters it covers. The encapsulant material typically includes a clear epoxy or another thermoset material, silicone, or acrylate. Alternatively, the encapsulant may conceivably include glass or a thermoplastic such as acrylic, polycarbonate, COC, or the like. The encapsulant may include materials that are solid, liquid, or gel at room temperature. The encapsulant may include transfer molding compounds such as NT 300H, available from Nitto Denko, or potting, encapsulation or other materials which start as a single part or multiple parts and are processed with a high temperature cure, two-part cure, ultraviolet cure, microwave cure, or the like. Suitable clear encapsulants may be obtained from Epoxy Technology of Billerica, Mass., from Nitto Denko America, Inc., of Fremont, Calif., or from Dexter Electronic Materials of Industry, California.

Encapsulant 203 provides structural integration for package 200, including retention of electrical leads 205, heat extraction member 204, emitters 202, and any conductive electrode wires 211. Encapsulant 203 covers emitters 202 and partially covers heat extraction member 204 and leads 205, permitting portions of heat extraction member 204 and leads 205 to extend through the sides or back of the encapsulant.

Encapsulant 203 may provide partial optical collimation or other beam formation of electromagnetic energy emitted by emitter 202 and or reflected by the surface of heat extraction member 204. For example, this beam formation may include collimating diffusing, deviating, filtering, or other optical functions. If package 200 includes a plurality of emitters 202, encapsulant 203 may provide partial mixing of energy. Encapsulant 203 also serves as a chemical barrier, sealant, and physical shroud providing protection of emitters, internal adhesives such as bonds 505, bond pads 502, conductor wires, wire bonds 211, and internal surfaces of heat extraction member 204 and electrical leads 205 from environmental damage due to oxygen exposure, exposure to humidity or other corrosive vapors, solvent exposure, mechanical abrasion or trauma, and the like. Encapsulant 203 provides electrical insulation. Encapsulant 203 may also provide a location permitting mechanical gripping or placing of package 200. Further, encapsulant 203 may provide for attaching or registering to adjacent components such as secondary optics, support members, secondary heat extractors, and the like.

In order to reduce the thermal coefficient of expansion of the encapsulant, increase the glass transition temperature of the encapsulant, or increase the thermal conductivity of the encapsulant, the encapsulant 203 may include a filler component. The filler type used depends somewhat on the optical effect that is desired, along with the physical properties desired.

If optical diffusion of the semiconductor optical emitter beam is acceptable or desired, the filler component may be any material with a substantially different index of refraction from the encapsulant 203 which exhibits desired properties such as low thermal expansion, high melting point, high chemical inertness and/or low oxygen or moisture permeability relative to the encapsulant itself. Typical filler materials with these desired properties may include $TiO_2$, glass, $Nb_2O_5$, $Al_2O_3$, diamond powder, and the like. The filler material may replace up to 70% by weight of the total encapsulant 203 in some cases, but is more typically in the range of 10% to 30%.

If optical diffusion of the semiconductor optical emitter beam is to be avoided, the inventors have discovered that the filler may be a powdered material or beads of a substantially clear material having an index of refraction matched with that of the bulk encapsulant material, within approximately ±15%. In a preferred embodiment, this index-matched filler comprises 50-137 micron $SiO_2$ beads mixed to 25% by weight of the total encapsulant. Alternatively, the filler material may be composed of nano-particles substantially smaller than the wavelength of light emitted by the emitter 202. In this embodiment, the nano-particles may not need to exhibit an index of refraction close to the bulk encapsulant. A nano-particle filler thus may provide the benefits of improving the thermal properties of the encapsulant 203 without substantially decreasing its transparency.

The encapsulant 203 may comprise a heterogeneous mass of more than one material, wherein each material occupies a portion of the overall encapsulant volume and provides a specialized function or property. For example, a stress relieving gel such as a silicone "glob top" may be placed over the emitter 202 and wire bonds 211. Such a localized stress relieving gel remains soft and deformable and may serve to cushion the emitter 202 and wire bonds 211 from stresses incurred during subsequent processing of the component or due to thermal expansion or shock. A hard molding compound, such as an epoxy, may then be formed over the stress relieving gel to provide structural integration for the various features of the component, to retain the electrical leads 205, to protect internal mechanisms of the component from environmental influences, to electrically insulate the semiconductor radiation emitters 202, and to provide various optical moderation of radiant energy emitted from the emitter 202.

If optical diffusion of the semiconductor optical emitter beam is acceptable or desired, the stress relieving gel may contain a diffusant for diffusing light from the emitter 202. Providing optical diffusion in the stress relieving gel portion of the encapsulant but not in the hard molding compound surrounding the gel may serve to provide for a smooth emission pattern and to mix light from multiple emitters, while still preserving the ability to substantially collimate light from the emitter 202 with a lens formed from the hard molding compound. The filler component to be mixed with the stress relieving gel may be any material with a substantially different index of refraction from the stress relieving gel which also exhibits desired properties such as low thermal expansion, high melting point, high chemical inertness and/or low oxygen or moisture permeability relative to the gel itself. Typical filler materials with these desired properties may include $TiO_2$, glass, $Nb_2O_5$, $Al_2O_3$, diamond powder, and the like. The filler material may replace up to 70% by weight of the total gel in some cases, but is more typically in the range of 10% to 30%.

Fillers used within the stress relieving gel may include a high thermal conductivity material such as diamond powder. Diamond is a chemically inert substance with an extremely high thermal conductivity. The presence of diamond in the stress relieving gel may significantly increase the thermal conductivity of the gel and provide an additional path for heat generated in an LED chip 202 to reach the heat extraction member 204 other than through the substrate of the chip. In many LED chips, the light emitting P-N junction is fabricated on a substrate with high thermal resistance, such as GaAs. Therefore, an additional path for heat generated at the junction to reach the heat extraction member 204 through the stress relieving gel will improve the efficiency of the emitter.

Figure 8:
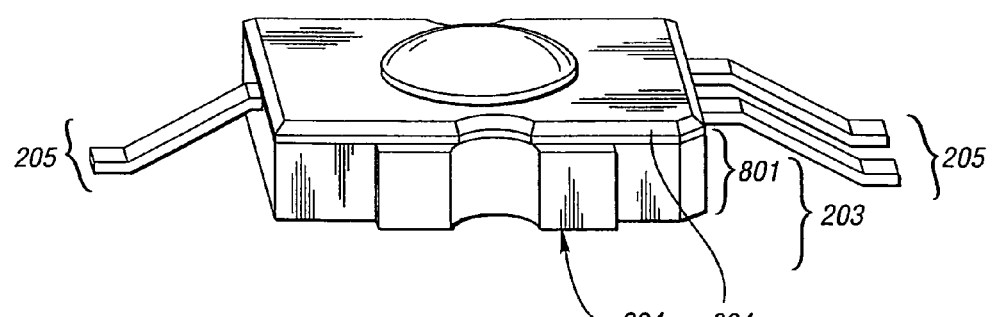
FIG. 8 shows an alternate embodiment of a semiconductor optical radiation emitter device.

In another embodiment, a portion of the overall encapsulant 203 may be composed of a substantially opaque material. As shown in FIG. 8, a first portion 801 of the encapsulant consists of a material that serves to cover a portion of each electrical lead 205 and retains the electrical leads 205 in position relative to the heat extraction member 204. This first portion does not cover the LED chip (hidden), the wire bonds (hidden) connected to the chip, and any critical optical enhancement surface of the heat extraction member 204 in the immediate vicinity of the chip. Therefore, this material need not be transparent or translucent to optical radiation emitted from the chip. A second portion 804 of encapsulant 203 is transparent or translucent and covers the LED chip and wire bonds. In this embodiment, an opaque encapsulant material may form the majority of encapsulant 203. As discussed hereinabove, some opaque encapsulants may possess more superior mechanical, chemical, and thermal properties than clear encapsulants and may be useful for providing improved durability electrical lead retention in the harshest of applications. In this embodiment, many of the superior characteristics of some opaque encapsulants can be realized while still providing mechanism for light emitted from the LED chip to exit the device.

In another embodiment, dyes or pigments may be blended or dispersed within clear portions of the encapsulant to alter the exterior appearance of the device or to tailor or augment the spectrum of radiation emitted by the radiation emitter and emanating from the device. Suitable dyes for these functions may include spectrally selective light absorbing dyes or tints well known to those skilled in the art. Fluorescent dyes, pigments, or phosphors may also be used within the encapsulant or more particularly in a stress relieving gel to absorb energy emitted by the optical radiation emitter and re-emit it at lower wavelengths as may be desirable in some embodiments of the invention.

Figure 9A:
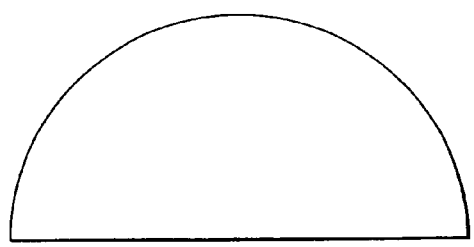
FIGS. 9a-9d are illustrations of various lens configurations.
Figure 9B:
Figure 9C:
Figure 9D:
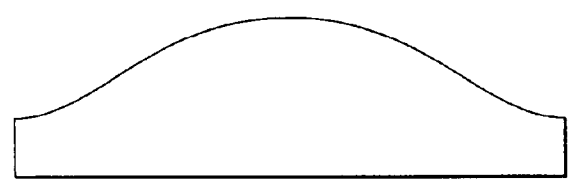

Referring to FIG. 2, energy radiated by emitter 202 travels through encapsulant surface 203a and exits the device into the ambient environment. Surface 203a may be formed as a plane as depicted in FIG. 2, or alternatively may take various shapes such as that of a dome as depicted at 401 in FIG. 4, depending on the desired emission pattern of the emitted optical radiation. It should be understood that most semiconductor optical radiation emitters radiate light in a substantially Lambertian pattern that must be optically modified for maximum device utility. To accomplish this, the encapsulant surface may be used as a collimator for the emitted radiation, for example, if shaped in the form of a spherical convex collimator as depicted in FIG. 9a, an aspheric convex collimator as depicted in FIG. 9d, or as a Fresnel lens, TIR lens, kinoform, binary optical element, HOE or the like as schematically illustrated in FIG. 9b. The encapsulant surface may alternately or additionally function as a diffuser if configured as a textured surface, a structured diffuser, stereographic diffuser, holographic diffuser, or the like as schematically depicted in FIG. 9c. As those skilled in the art will appreciate, optic 401 (FIG. 4) will function in conjunction with cup 301 (FIG. 3) to tailor the emission pattern of the device for the desired application.

Method of Manufacturing the Invention

Figure 12A:
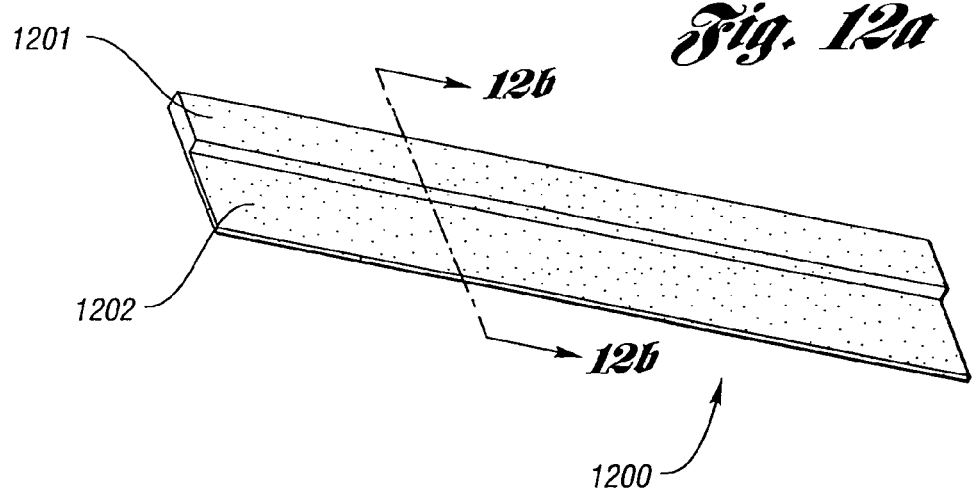
FIGS. 12a-12c are perspective and cross-sectional drawings illustrating an integral metal strip for use in manufacture of a leadframe.
Figure 12B:
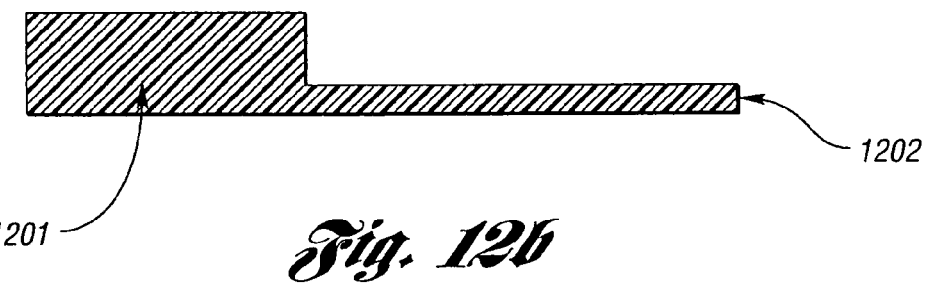
Figure 12C:
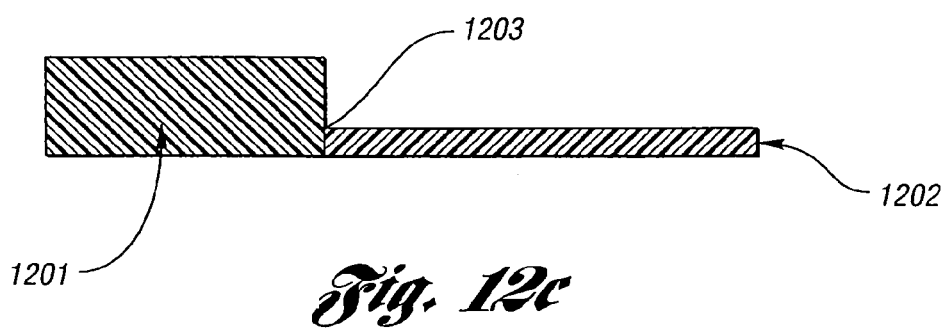

A method for manufacturing the optical radiation emitter package will now be described with reference to FIGS. 2-4 and 10-13:

Formation of the leadframe 1101 (FIG. 11) begins from a common strip or plate of metal 1200 as indicated in FIG. 12a. Metal strip 1200 preferably contains a thin portion 1202 and a thick portion 1201. The thin portion shall be used primarily for the formation of the electrical leads and the thick portion shall be used primarily to form the heat extraction member. A cross section of metal strip 1200 is shown in FIG. 12b. The differential thickness of the portions 1201 and 1202 may be formed in a variety of ways. For instance, a uniform thickness metal strip may be rolled through a die that selectively compresses a portion of the strip. A common solid metal strip with a variable thickness cross section as shown in FIG. 12b would result from such a process. Alternatively, two metal strips of different thickness can be bonded together as in FIG. 12c and connected at joint 1203. Joint 1203 may be formed by welding, soldering, and the like, and it should be understood that the transition between thicknesses at joint 1203 may be abrupt or smooth, depending on the intended application of the leadframe.

Thick metal section 1201 and thin metal section 1202 need not necessarily be of the same composition. For example, thin metal section 1202 may be composed of steel and thick metal section 1201 may be composed of copper. Also, the use of a metallic material for metal sections 1202 and 1201 is usually preferable but not mandatory. Any electrically conductive material suitable for construction of the electrical leads 205 may be used for the thin metal section 1202 and any thermally conductive material (ceramic, for instance) suitable for construction of the heat extraction member 204 may be used for the thick metal section 1201. Finally, it should be noted that metal strip 1200 need not be composed of two differing thickness sections. A leadframe containing electrical leads of thickness similar to heat extraction member 204 is still within the scope and spirit of the present invention so long as electrical leads 205 do not form the dominant path for extraction of thermal energy from semiconductor optical radiation emitter 202. To facilitate the construction of alternative embodiments shown in FIGS. 16-19, 21, and 23, metal strip 1200 may be composed of more than two sections having multiple thicknesses. In any event, the construction of metal strip 1200 from one or more metallic or possibly non-metallic materials of uniform or varying thickness results in what will be defined to be an integral metal strip for the purpose of this invention.

Figure 13:
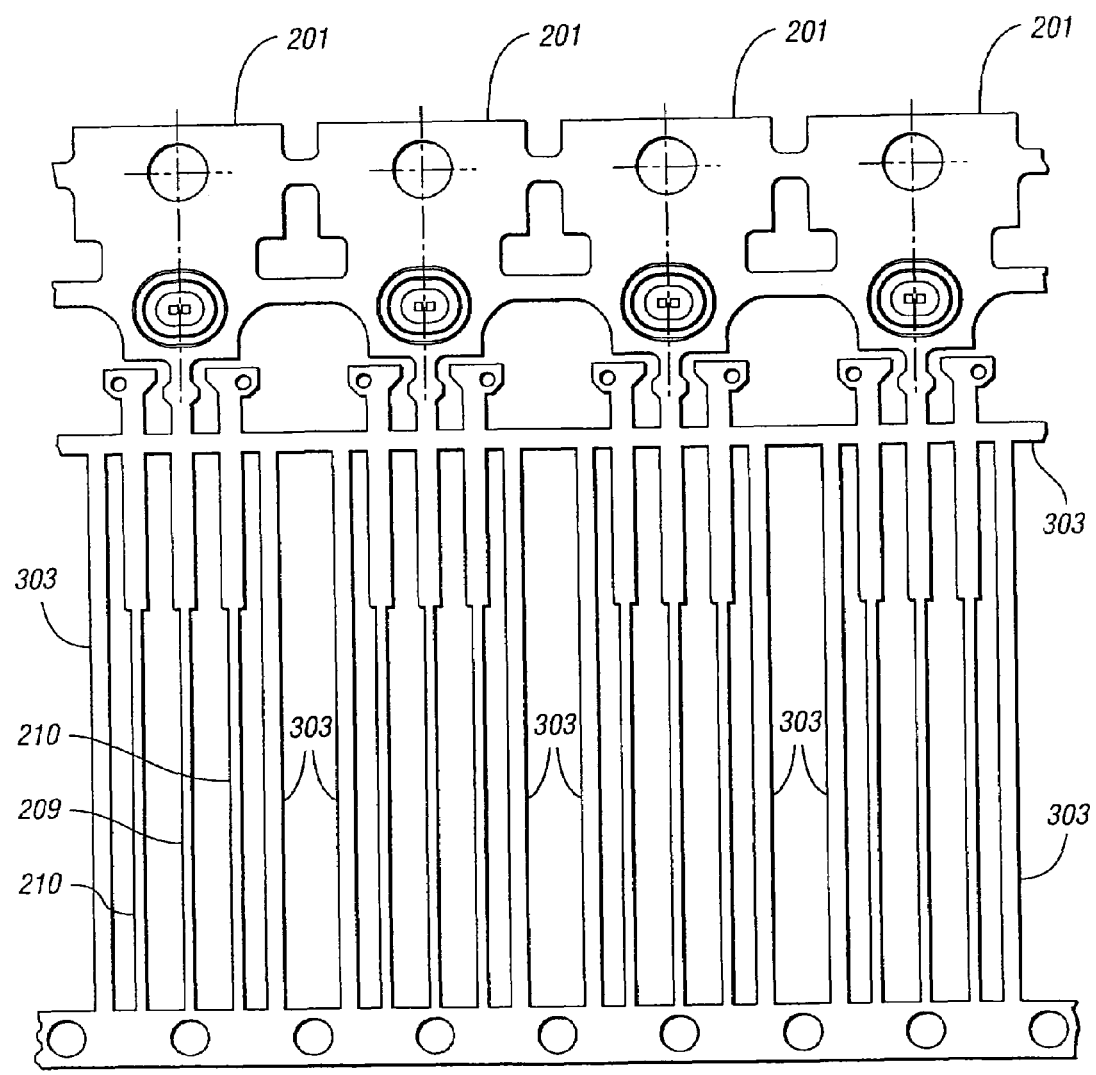
FIG. 13 is a drawing illustrating a set of leadframes connected by tie-bars.

Formation of the leadframe from integral metal strip 1200 occurs by a common die stamping or rolling process. This process, well known to those skilled in the art of leadframe construction, involves various stages of stamping, coining, piercing and shearing to remove, shape, stamp, bend, compress or otherwise form the material from integral metal strip 1200 into the desired shape of leadframe 201 (FIG. 13). In particular, material is removed surrounding electrical leads (209 and 210) partially isolating them from one another and separating isolated electrical leads 210 from heat extraction member 204. Additionally, reflector cup 301, as well as slots, tabs, and through-holes described above, may be stamped into the thick metal section 1201 of integral metal strip 1200.

At the time of construction of leadframe 201, various tie-bars 303 are left remaining on leadframe 201 to mechanically connect electrical leads (209 and 210) and heat extraction member 204 to one another and retain their relative positions during the subsequent assembly of the final device. Tie-bars 303 may be operative to connect several of leadframes 201 to one another. This facilitates the mass production of several devices simultaneously to reduce cost and improve the throughput of the manufacturing process of this device.

After formation of the metal strip 1200 into a series of leadframes 201, these leadframes may be plated or coated 1102, completely or selectively, with a variety of materials to improve thermal emissivity, improve optical characteristics, improve solderability, or provide for corrosion resistance. However, those skilled in the art will understand that some or all of this plating may take place prior to formation of the leadframes.

Semiconductor optical radiation emitter(s) 202, assumed to be LED chips for this discussion, are mounted onto the leadframe 201 in the following manner. Preferably, a strip of leadframes attached by tie-bars 303 as shown in FIG. 13 is used for mass assembly of the device. A conductive epoxy or other material suitable for die-attach is then dispensed 1103 on to the heat extraction member 204 at the position where the LED chip(s) are to be attached, for example, in a reflective cup 301 stamped into the heat extraction member. The LED chip(s) are then placed onto the die-attach material preferably using automatic die placement equipment 1104. The die-attach material is then cured by the method appropriate for the material used.

After the LED die 202 has been attached to the heat extraction member 204, wire bonds 1105 are made from the electrode bonding pads on the LED die to the electrical leads. Wire bonds are preferably made using thermosonic ball bonding with gold wire. However, use of aluminum or other wire material is also suitable as is the use of alternative bonding techniques such as ultrasonic wedge bonding.

If a stress relieving gel is to be used (with any optional fillers, diffusants, and the like dispersed therein), the gel is then dispensed 1107 onto the LED chip(s) and wirebonds and then cured by a method appropriate for the gel material.

Next, the encapsulant 203 (with any optional fillers, diffusants, and the like dispersed therein) is formed to cover the LED chip(s) 202 and wirebonds 211, and to partially cover the electrical leads 205 and heat extraction member 204 and provide the various integration, protection, optical and other functions described hereinbefore.

The encapsulant 203 may be formed 1108 by a variety of processes well known to those skilled in the art such as encapsulation molding, potting, casting, resin transfer molding, insert molding and the like.

After the molding process is completed, tie-bars 303 must be removed from the leadframe 201 to electrically isolate the electrical leads 205 and separate the individual packages from one another. This process, commonly known as singulation, occurs by shearing operations 1109 in which the devices are placed into a die or other clipping mechanism which shears away the tie-bars 303 at the points where they connect to the electrical leads 205 and the heat extraction member 204.

A final step in the construction of this device that facilitates mass manufacturing of systems containing the device is to adhere the individual devices onto a continuous tape at evenly spaced intervals 1110. This method of packaging, commonly referred to as tape-and-reel or tape-and-ammo packaging, facilitates subsequent loading of the devices into automatic insertion or placement equipment configured to electronic assembly industry standards. The process for packaging the devices into a taped configuration is well understood in the industry.

EXAMPLE

An example of a specific embodiment illustrating the use of the invention follows:

The leadframe 201 in this example was constructed with three leads 205 extending from one side of the encapsulant 203 and a portion of the heat extraction member 204 extending from the opposite side and exposed through the back of the encapsulant 203. This configuration is illustrated in FIGS. 3 and 4. The total heat extraction member 204 is a generally rectangular shape 13 mm long and 1.35 mm thick. A portion of the heat extraction member extends 6 mm from the encapsulant 203 and is 11 mm wide. The tab contains a mounting hole which is 2 mm in diameter. The remainder of the heat extraction member covered by the encapsulant 203 is a modified rectangular shape 8 mm wide and contains a cup 301 centered 2 mm up from the end of the heat extraction member nearest the leads. The cup is generally oval in shape being 0.64 mm wide and 1.3 mm long at the base, and 0.88 mm deep. The wall on the cup has a 32.6 degree draft as measured from the normal to the bottom surface.

Three electrical leads 205 are present in the example, the middle cathodic electrical lead 209 being integral with the heat extraction member, and the remaining two leads 210 being electrically isolated. The leads are 0.51 mm thick by 0.87 mm wide and approximately 9.0 mm long as measured from the standoff seating plane to the point where the leads enter the encapsulant of the device. The leads 205 and the heat extraction member were formed from a single piece of copper. The entire leadframe 201 was coated with a nickel and palladium plating.

Two red-orange LED emitters are used in this example. Each of these emitters is an AlInGaP LED die 0.016" by 0.016" in size formed on a GaAs substrate with a peak emission at a wavelength of about 615 nm. Both emitter dies 202 were bonded to the heat extraction member 204 at the base of the cup 301 using a conductive die-attach epoxy 6030 HK, available from Diemat, Mass. Cathodic contact is made at the base of both emitter dies 202 through the die-attach 505 which electrically connects the cathodes of both dies to the center integral cathodic electrical lead 209. A circular bonding pad 502 on the top of each die facilitates anodic connection to each die. An 0.003" diameter aluminum/1% silicon wire was used to form a wire wedge bond connecting the anodes of each of the dies to the isolated electrical lead 210 nearest each die.

The assembly was then encapsulated in a clear epoxy using an encapsulant molding process. Clear potting epoxy 301-2FL, available from Epoxy Technology, Inc., Massachusetts, was molded over the leadframe to the desired shape and cured. The shape of the resulting encapsulant is shown in FIG. 3. Specifically, the encapsulant is composed of a generally rectangular section 10 mm wide by 9 mm tall and 3.8 mm thick. The lens 401 positioned atop the rectangular section and centered over the cup in this example is a spherical convex surface having a radius of curvature of approximately 2.5 mm and an aperture of approximately 5.0 mm. The distance from the tip of the lens to the top of the die was approximately 4.9 mm.

Figure 14:
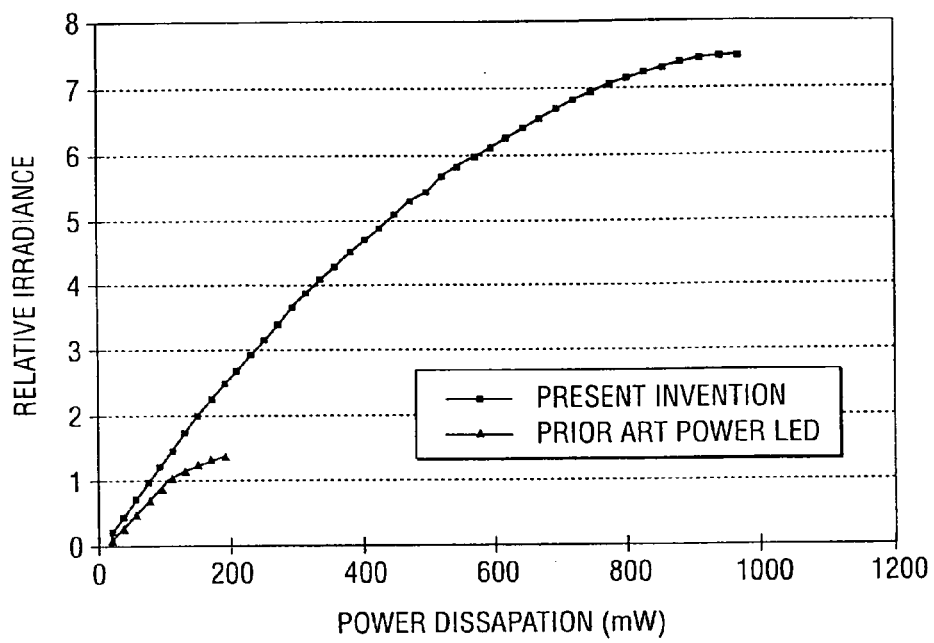
FIG. 14 is a graph of the relative irradiance versus power dissipation for a semiconductor optical radiation emitter device versus a prior art LED.
Figure 15:
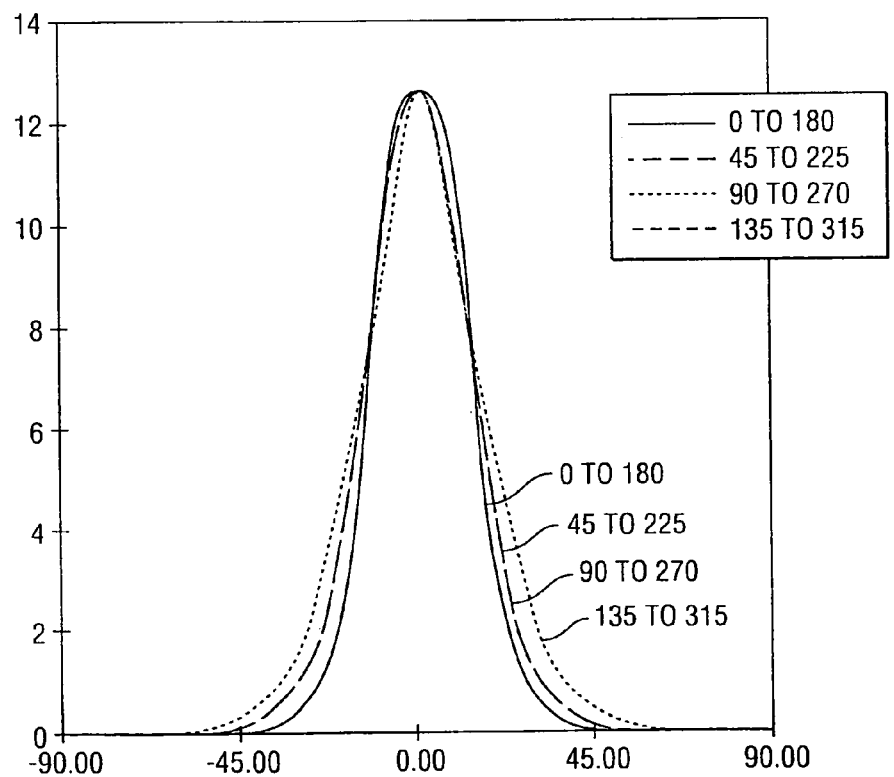
FIG. 15 is a theoretical intensity versus angle plot for a semiconductor optical radiation emitter device.

The performance of the device was measured by applying separately controlled positive voltages to each of the two isolated anodic electrical leads using two separate power supplies. Ten-ohm ballast resistors were placed in series between the positive terminal of the power supplies and each isolated anodic electrical lead 210 to establish the desired current through each emitter 202. The negative terminals of each supply were connected to each other and to the common center cathodic integral electrical lead 209. A plot of the total power dissipated versus relative irradiance of the device, compared with that of a commercially available prior art solderable power LED, is shown in FIG. 14. As illustrated, the current invention is capable of dissipating nearly five times the power of the prior art device. FIG. 15 is intensity versus angle plot showing the distribution of light emitting from the device 200.

Referring again to FIG. 14, it should be noted that the relative irradiance of the plots exhibit a characteristic exponential rise up to an asymptotic maximum as power is increased. The asymptotic maximum reached in relative irradiance represents the maximum effective power capacity of the semiconductor optical radiation emitter under study. It should be understood that the relative irradiances shown in this figure are normalized at about 20 mW for comparative purposes. It should be further understood that the relative irradiance measurements were further made at thermal equilibrium, i.e., after the specified power was applied at steady state for an extended period of at least five minutes. The asymptotic maxima are shown as about 160 mW and 900 mW for the two devices studied, although it should be understood that these measurements apply to the devices under test by themselves, unattached to a printed circuit board or heat sink, and using high thermal resistance connections to thermally isolate the device. Practically speaking, a more useful rating of the power capacity of each device is the practical effective power capacity of the semiconductor optical radiation emitter, which we estimate equals the power at which the device emits about 75 percent of its peak relative irradiance.

For the devices illustrated in FIG. 14, these practical effective power capacities are about 140 mW and 675 mW, respectively. The performance behavior illustrated is consistent with devices having thermal resistances between the junction and ambient of about 300 degrees C./W without heat sinking, and further correspond to practical electrical current capacities of about 65 mA and about 300 mA for devices containing emitters with about 2.1 volts forward voltage.

Semiconductor radiation emitter packages may be made in a wide variety of leadframe, emitter and encapsulant configurations without departing from the scope and spirit of the present invention. For purposes of comparison, devices made in accordance with the teachings contained herein are envisioned with maximum practical power capacities preferably ranging from about 150 mW to about 300 mW, more preferably ranging from about 600 mW to about 800 mW, and can range from more than about 1.0 W to 1.5 W for heatsinked versions.

Devices made in accordance with the teachings contained herein may preferably exhibit thermal resistance from junction to ambient of less than about 200 degrees C./W to about 250 degrees C./W, more preferably range from less than about 100 degrees C./W to less than about 25 degrees C./W, and can be less than about 15 degrees C./W for heat-sinked versions.

Devices made in accordance with the teachings contained herein and configured for emission of visible light may preferably radiate luminous flux greater than about 1 lumen to 2.5 lumens, more preferably may radiate 4.0 to 6.0 lumens, and may radiate greater than 10.0 lumens.

Alternative Embodiments

Upon consideration of the present invention, one skilled in the art will realize that many various configurations and embodiments of the present invention are possible in addition to the example just presented. By varying the number of electrical leads 205, the orientation of the electrical leads, employing different lead bend configurations, varying the size, shape, and orientation of the heat extraction member 204, using multiple emitters 202 of various types, and varying the encapsulant configuration 203, it is possible to configure the present invention for use in a side-looker configuration, end-looker configuration and as a through-hole device or surface-mount device. Alternative embodiments are presented below to illustrate the flexibility of the present invention to adapt to various system and assembly configurations. These embodiments represent only a subset of the possible alternative configurations and should not be construed as limiting the scope of the invention to those configurations explicitly described.

Figure 16A:
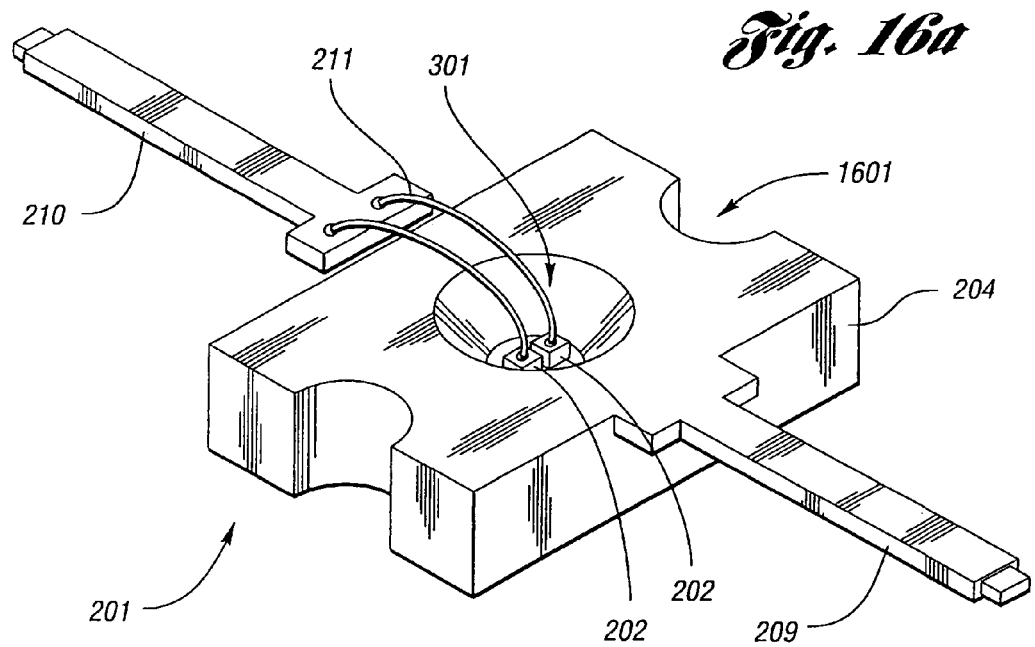
FIGS. 16a and 16b show an alternate embodiment of a semiconductor optical radiation emitter device with and without encapsulation.
Figure 16B:
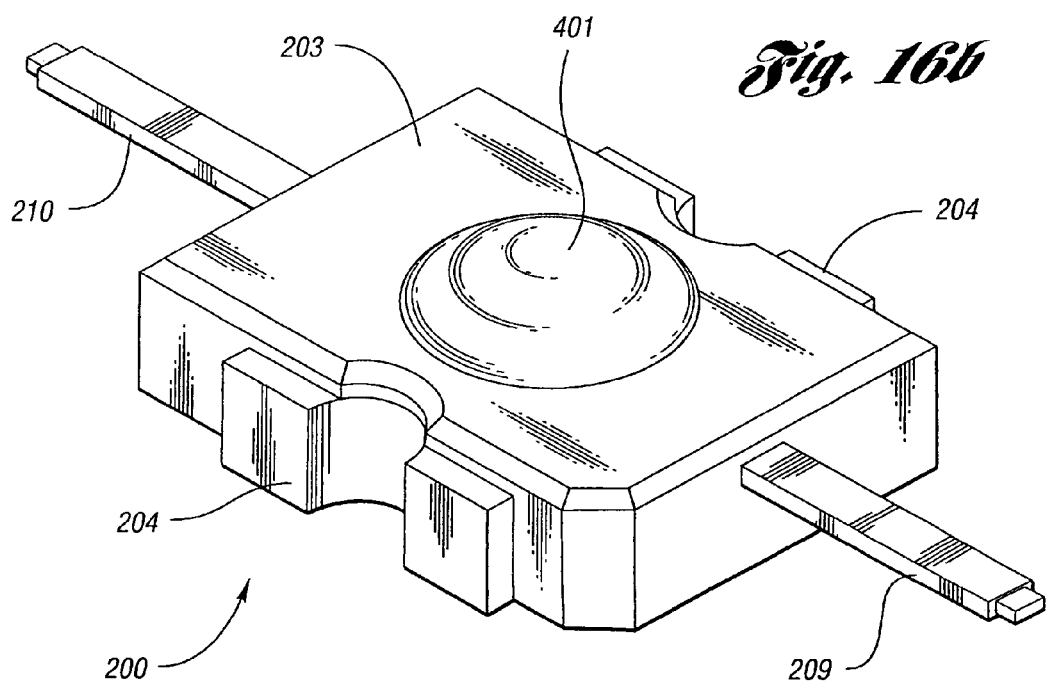

FIG. 16a illustrates an embodiment in which two electrical leads extend from opposite sides of the heat extraction member 204. One electrical lead 209 is an integral electrical lead mechanically and electrically attached to the heat extraction member 204 while the opposite electrical lead 210 is an isolated electrical lead. Two LED chips 202 are mounted within a cup 301 stamped into the heat extraction member 204 forming an electrical contact between the cathode of each die 202, located at the base of the die, and the integral electrical lead 209. Both dies 202 are assumed to be of the same configuration and thus the anode of each die can be electrically connected to the same isolated electrical lead 210 via wire bonds 211. FIG. 16b illustrates an encapsulant 203 formed over the leadframe shown in FIG. 16a. As illustrated, the leads 209 and 210 extend from opposite sides of the encapsulant 203 and the heat extraction member 204 extends from the two opposite sides orthogonal to the sides through which the leads 209 and 210 extend. Cylindrical cutouts 1601 are present in the heat extraction member 204 and encapsulant to facilitate gripping by automatic insertion equipment. A lens 401 is present in the encapsulant 203 centered over the cup 301 in the heat extraction member 204 to provide partial collimation of light emitting from the LED chips 202.

Figure 17A:
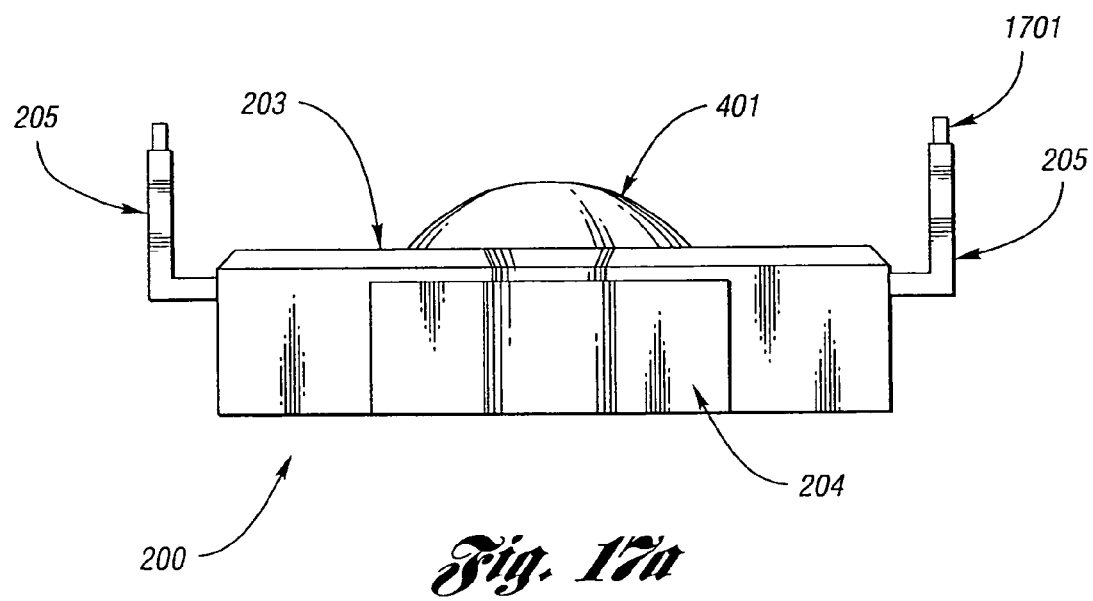
FIGS. 17a-17c show yet other various views of another alternate embodiment of a semiconductor optical radiation emitter device.
Figure 17B:
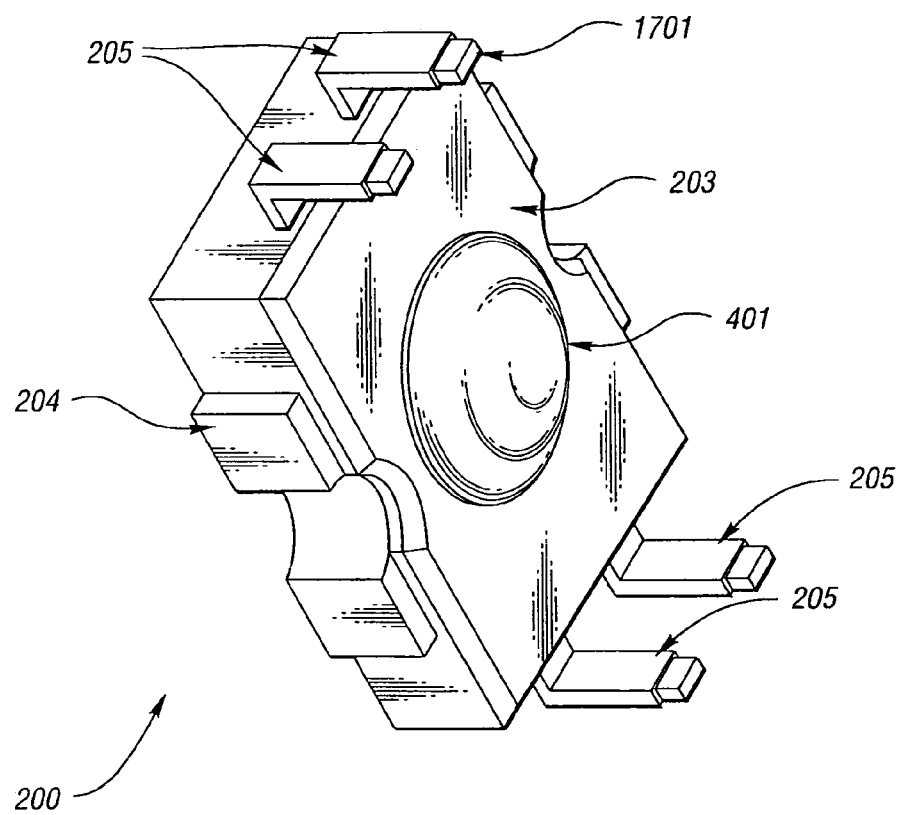
Figure 17C:
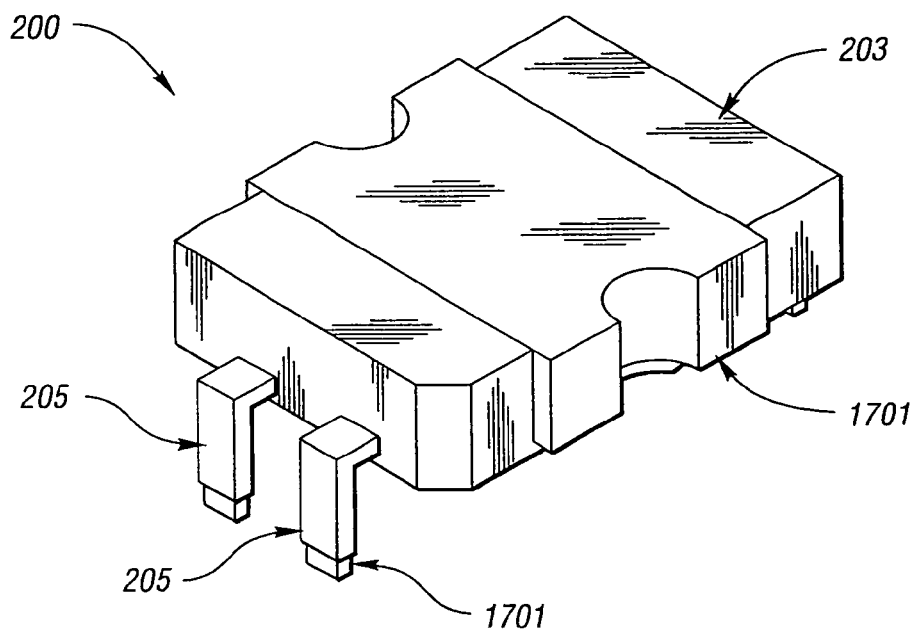
Figure 18:
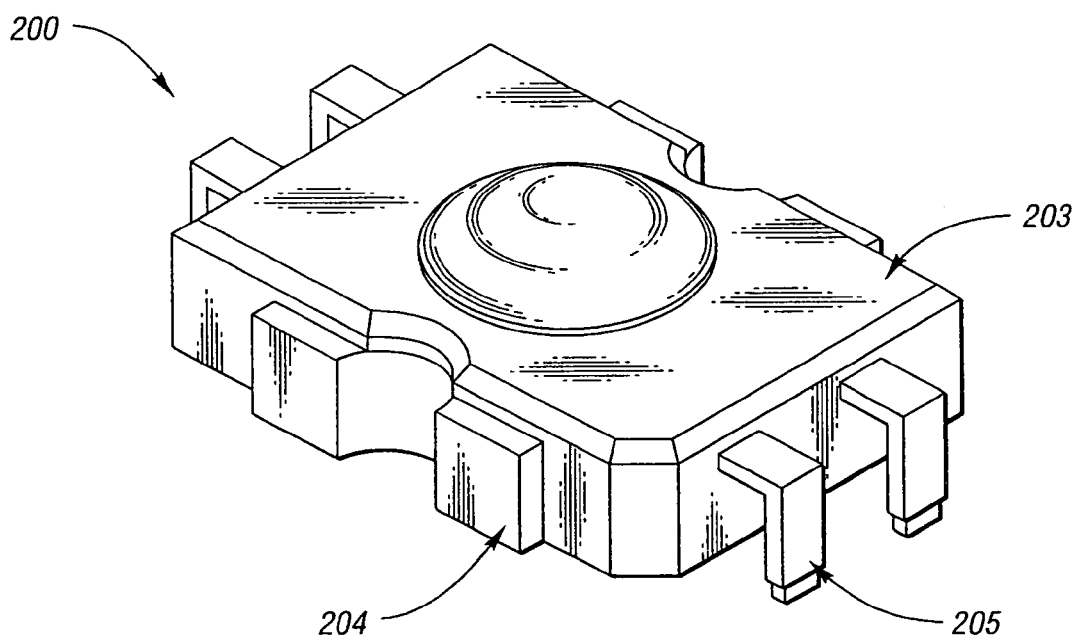
FIG. 18 shows yet another alternate embodiment of a semiconductor optical radiation emitter device.

An embodiment similar to that of FIG. 16 is shown from three views in FIGS. 17a, 17b, and 17c. In this embodiment, four electrical leads 205 are provided instead of two. The electrical leads 205 are bent 90 degrees forward towards the direction of optical emission. The device is constructed to mount onto a printed circuit board and radiate light in the direction of the board. Standoffs 1701 allow precise registration of the distance between the top of the lens 401 and the plane of the circuit board. Typically, a hole would be present in the circuit board to allow the light to shine through. This configuration is occasionally useful when system constraints require light to shine through a circuit board. Bending the leads 205 in the opposite direction, as shown in FIG. 18, enables a typical end-looker configuration where the direction of radiation is away from the plane of the circuit board. As shown in FIG. 17c, a back view of the embodiment, the heat extraction member 204 extends from two sides of the encapsulant and is exposed through the rear of the encapsulant 203 allowing a large exposed surface area for the radiation of heat.

Figure 19A:
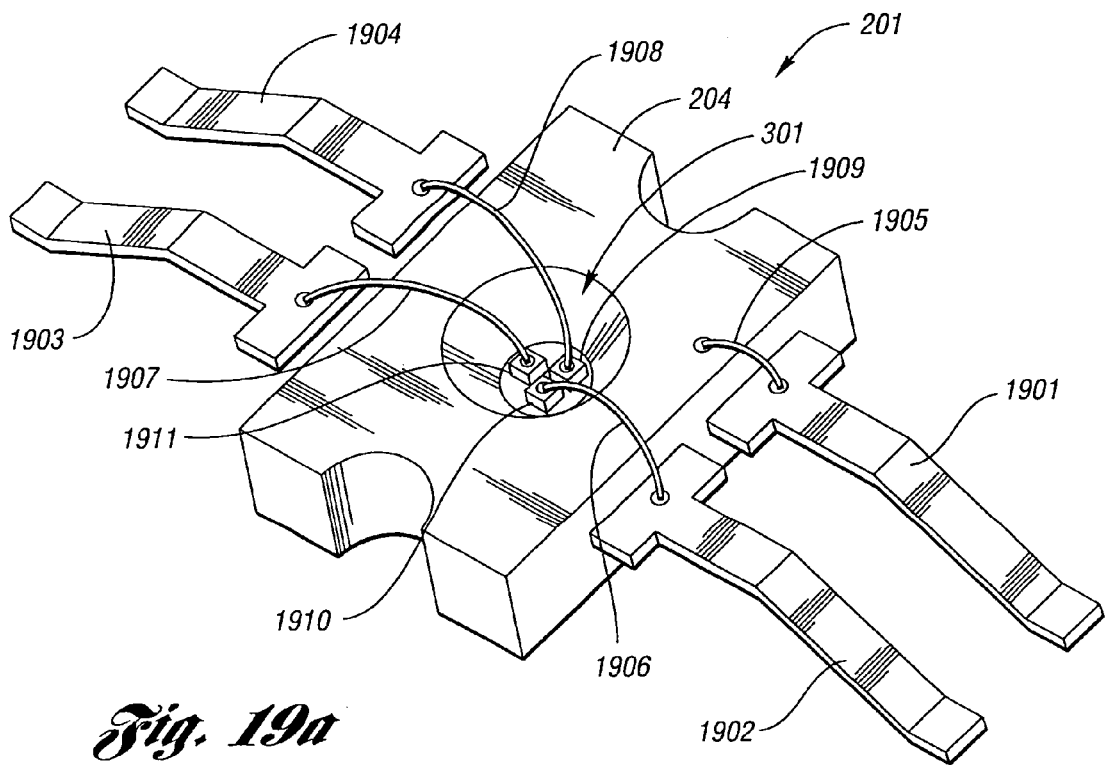
FIGS. 19a and 19b show yet another alternate embodiment of a semiconductor optical radiation emitter device with and without encapsulation.
Figure 19B:
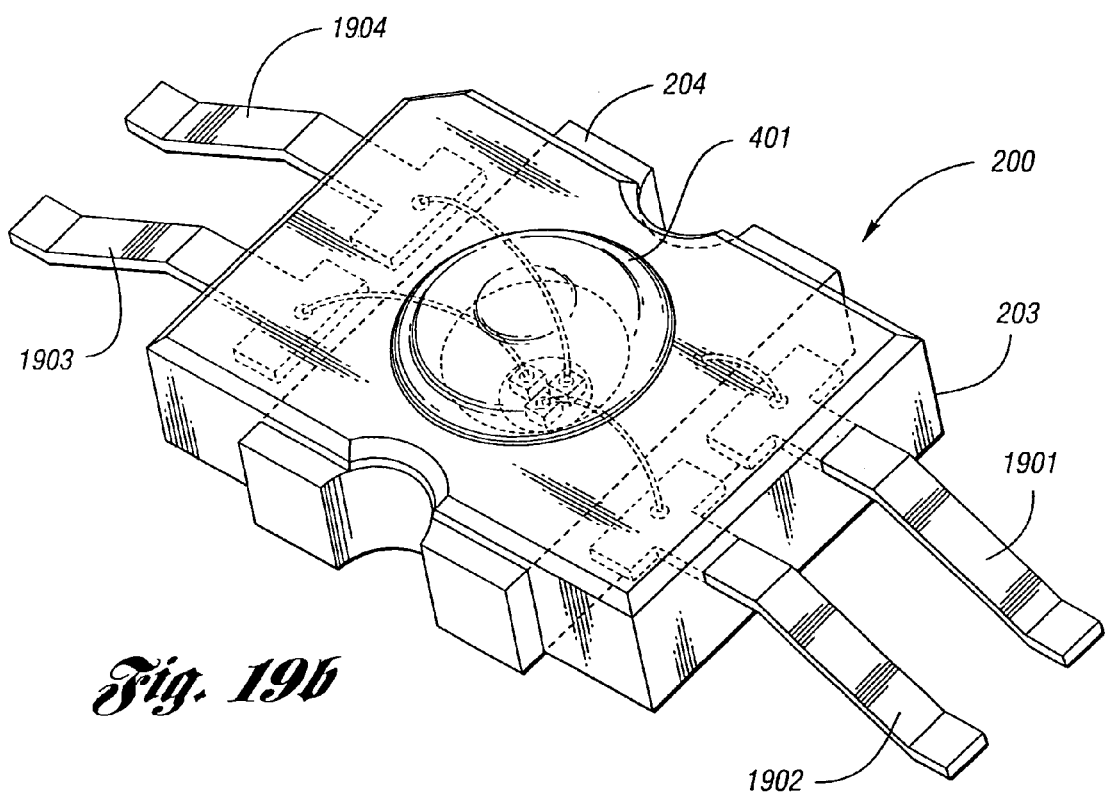

An embodiment suitable for surface-mount assembly is shown is FIGS. 19a and 19b. The heat extraction member 204 is configured similarly to the embodiments shown in FIGS. 16 and 17; however, the cup 301 is enlarged to contain three emitters. All electrical leads are isolated electrical leads 210 to maximize the thermal resistance from the circuit board, through the leads, and to the emitter. Electrical contact to the cathode of each die is made through the base of the die, each of which is electrically and mechanically bonded to the heat extraction member, through a wire bond 1905, and through electrical lead 1901. The anode contact of each die 1909, 1910, and 1911, is made through wire bonds 1906, 1907, and 1908, and through electrical leads 1902, 1903, and 1904, respectively. The electrical leads are bent as shown to allow surface mount attachment to a circuit board. An encapsulant 203 covers the leadframe 201 with a lens 401 formed directly above the cup 301. The heat extraction member 204 extends out two sides of the encapsulant and is exposed from the back. This configuration is of particular interest when the three dies 1909, 1910, and 1911 emit at red, blue, and green wavelengths, respectively. The current to each die can be independently controlled through isolated electrical leads 1902, 1903, and 1904 allowing the emission of light formed by a combination of a ratio of red, blue, and green colors. As is well known, a combination of red, blue, and green colors can be used to produce light of any color desired. Therefore, the device of this example can be used to produce emitted light of any desired color. Such a device would be especially useful in the construction of large signs or TV screens for use in large stadiums or similar places.

Figure 20:
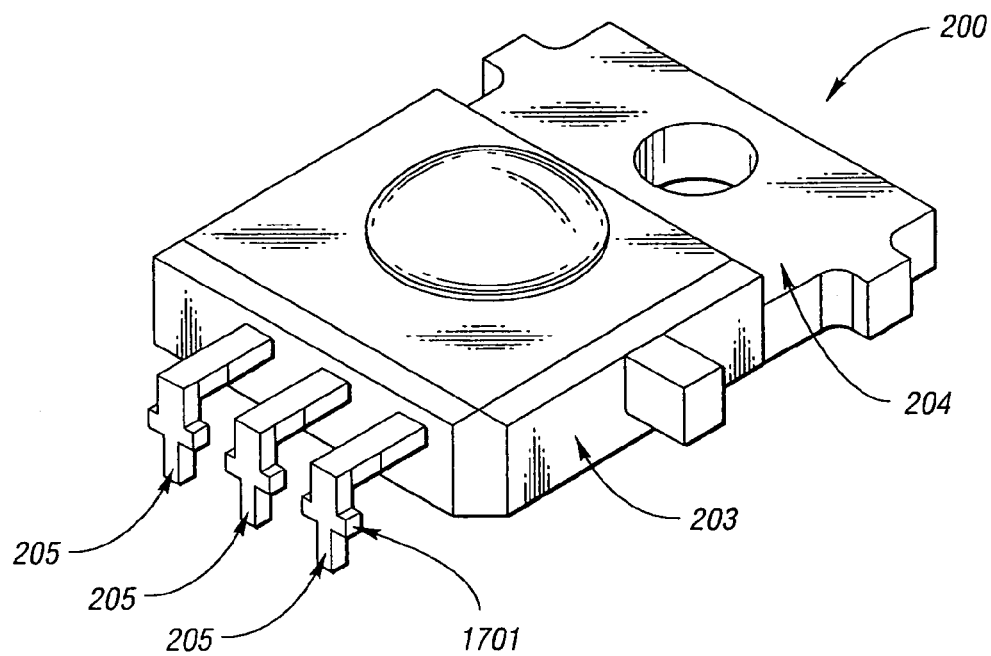
FIG. 20 shows yet another alternate embodiment of a semiconductor optical radiation emitter device.

FIG. 20 shows an embodiment similar to that of FIG. 3, discussed hereinabove, with the exception that the leads 205 are bent 90 degrees away from the primary direction of optical emission. This simple lead bend configuration allows the use of the device in an end-looker configuration. Although shown for through-hole assembly, leads 205 could be bent similarly to those of FIG. 19 to support surface-mount assembly.

Figure 21:
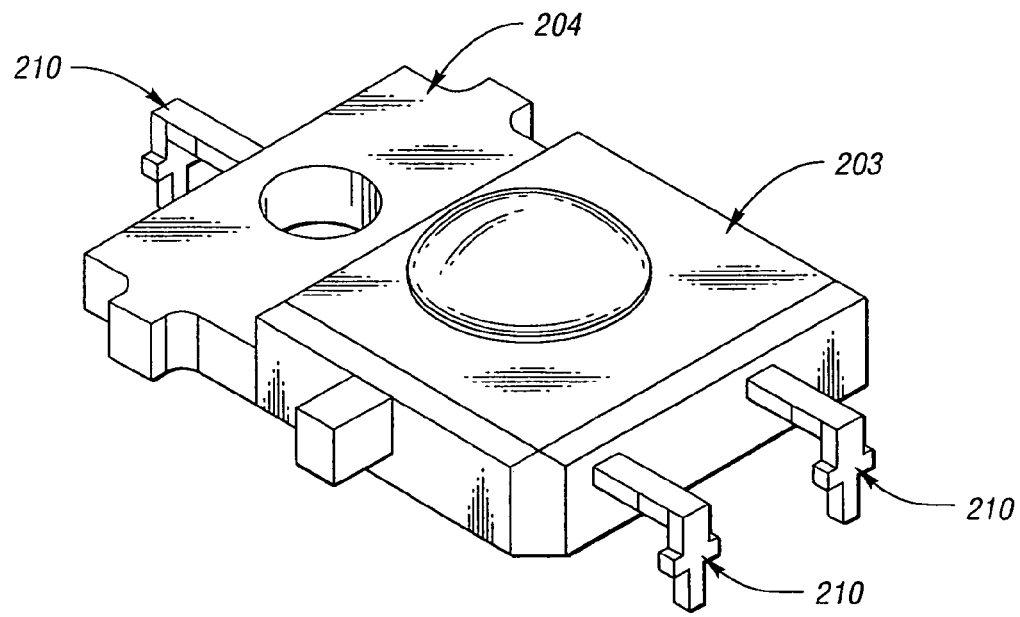
FIG. 21 shows yet another alternate embodiment of a semiconductor optical radiation emitter device.

In the embodiment shown in FIG. 21, two isolated electrical leads 210 extend from one side of the encapsulant 203 with the heat extraction member 204 extending from the opposite side. A third integral electrical lead 209 extends from the heat extraction member 204. The joint between the heat extraction member 204 and the integral electrical lead 209 occurs external to the encapsulant 203. This embodiment may be for end-looker applications when structural considerations dictate that the device be retained by a solder connection from at least two sides of the device.

Figure 22:
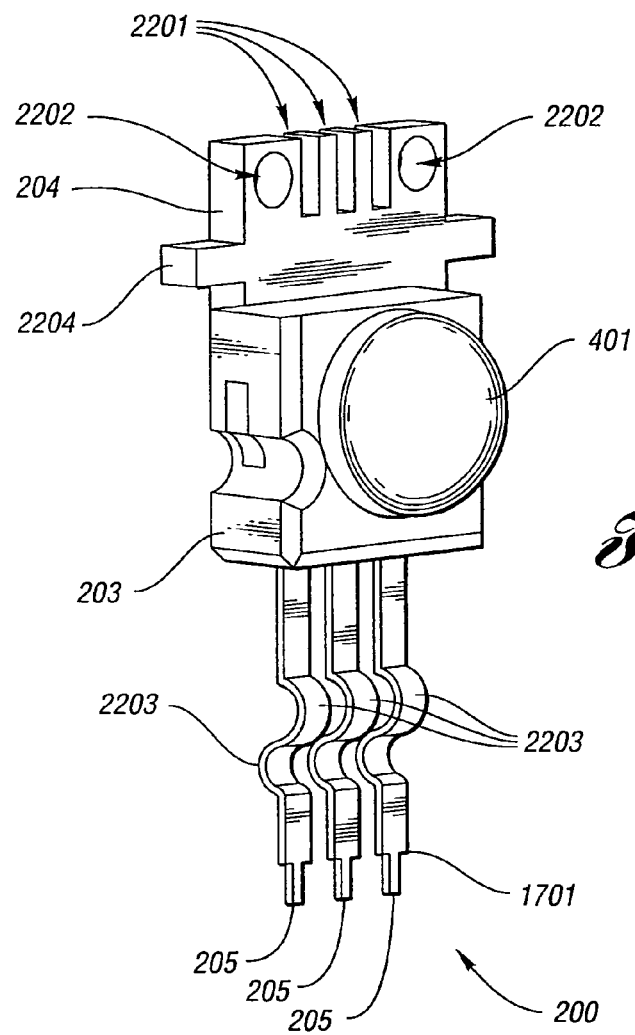
FIG. 22 shows yet another alternate embodiment of a semiconductor optical radiation emitter device.

An embodiment illustrated in FIG. 22 shows many modifications that can be made to the heat extraction member 204 or the leads 205 to realize various benefits. Holes 2202 are present in the heat extraction member 204 for mounting of the device and to increase the surface area of the heat extraction member 204 and thus increase heat emission. Fins 2201 added to the heat extraction member 204 also increase the surface area of the heat extraction member 204. Tabs 2204 extend from the heat extraction member 204 to increase its volume and size. These tabs 2204 may be the remnants of the tie-bars 303 used to hold several leadframes 201 together during assembly. S-shaped bends 2203 in the leads 205 allow the leads to be bent to various angles without placing excessive stresses on the joints between the leads 205 and the encapsulant 203 which retains them. Finally, standoffs 1701 serve function to register the package at a certain height above the circuit board into which it is inserted.

Figure 23:
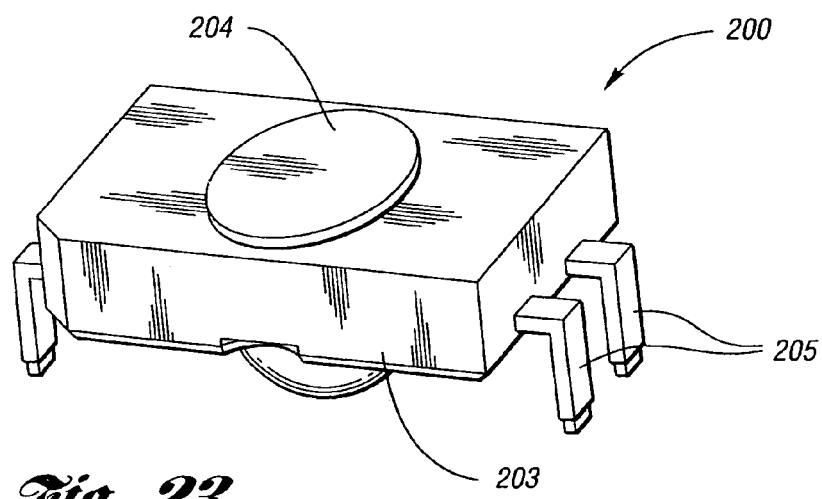
FIG. 23 shows yet another alternate embodiment of a semiconductor optical radiation emitter device.

FIG. 23 shows yet another potential configuration similar to that of FIG. 17, except that in this figure, the heat extraction member 204 has an oval shape and is exposed solely though the backside of encapsulant 203.

Figure 24:
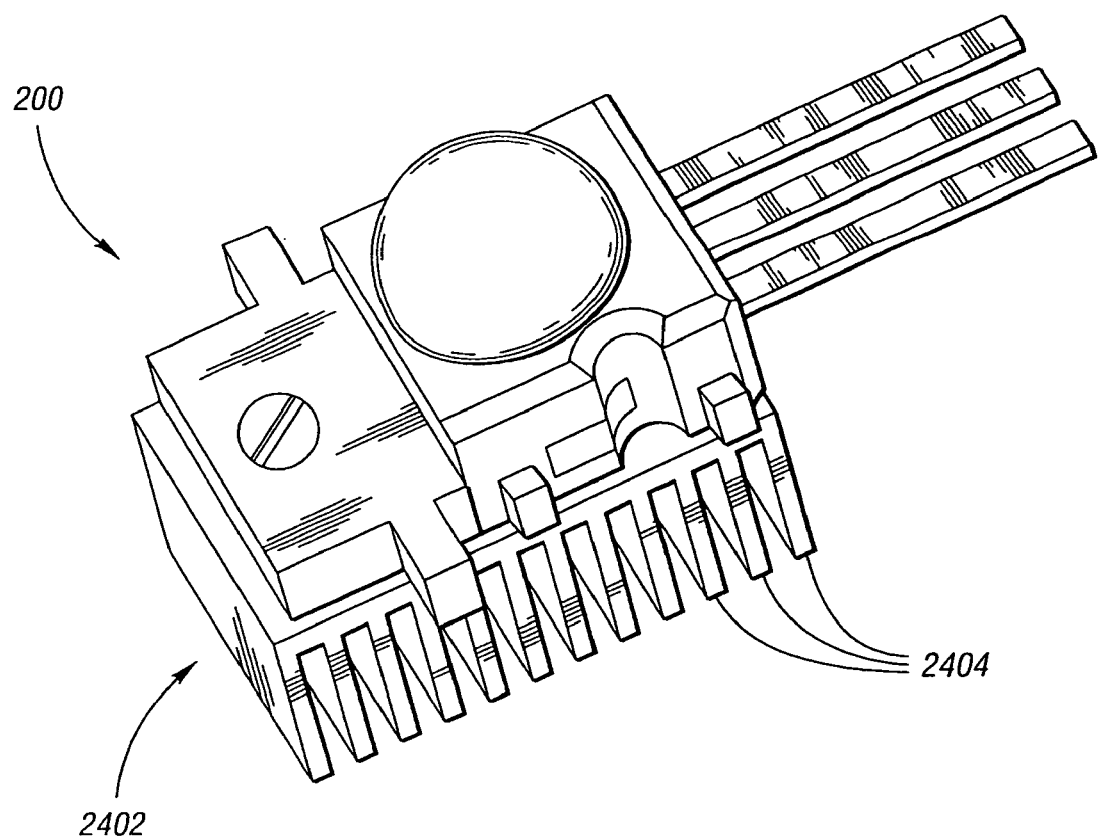
FIG. 24 shows a semiconductor optical radiation emitter device mounted on a heat sink.

Referring to FIG. 24, an important feature of the present invention is the ability to easily attach a passive or active heat sink (generically referred to as 2402) to the package 200 and obtain a significant improvement in the performance of the device. The attachment of a passive heat sink to the heat extraction member of the device significantly increases the heat capacity of the system over that of the isolated device. Additionally, heat sinks incorporating fins 2404 to increase their surface area may serve to substantially improve the radiation of heat into the surrounding environment when attached to the heat extraction member of the package. Heat sinks suitable for this application are available from Aavid Thermal Products, Inc. of Concord, N.H. The addition of a heat sink to the package may increase its power dissipation capability by 50% or more.

The use of an active cooling mechanism, such as a thermoelectric cooler based upon the Peltier effect, can increase the power dissipation capability of the system substantially. Again, configurations of the present invention such as those shown in FIG. 3 leave a large surface of the heat extraction member exposed onto which a thermoelectric cooler could be attached. In the present invention, a thermoelectric cooler can be attached to the package such that the cooler side of the thermoelectric cooler, for the given polarity, is thermally bonded to the heat extraction member. The other side of the cooler can be attached to a passive heat sink or other large heat capacity structure.

Thermoelectric cooler modules are typically constructed by sandwiching an array P and N doped Bismuth Telluride dies between two ceramic plates, although different semiconductor materials may also be used. Alternating P and N dies are connected electrically in series by metallized traces on the inside surfaces of the ceramic and thermally in parallel by the ceramic itself. Passing current through the die results in a temperature differential between the two plates of ceramic. Thermoelectric coolers constructed in this manner are commonly used for the cooling of electronic components such as computer CPUs. Thermoelectric coolers are commercially available from Advanced Thermoelectric Products, Inc. of Nashua, N.H.

To facilitate effective thermal coupling of the heat extraction member to such passive or active heat sinks, an alternative embodiment of the present invention may include an additional heat sink pad or thermally activated heat sink compound attached to or disposed on an exposed surface of the heat extraction member. Such thermal coupling agents or layers may take the form of a gel or solid and may play an additional role as an adhesive. Addition of such a layer could be incorporated into the manufacturing process disclosed hereinabove for semiconductor optical radiation emitters of the present invention at any point after the device encapsulation is formed. In the case where such heat coupling layer takes the form of a gel, a heat activated phase-change thermal coupling pad, or a solid material carrying a pressure sensitive adhesive, a release liner could be employed to cover the layer at the time of device manufacture until application of the device in assembly at a later time.

The unique high power capacity, manufacturability, and thermal efficiency of devices of the current invention, in combination with their inherent amenability to incorporate more than two electrical leads having independent functions and two or more semiconductor optical radiation emitters of differing types, make the present invention particularly useful for semiconductor illumination and power signaling applications. In a related embodiment of the current invention, the semiconductor optical radiation device functions as an LED white light source. Devices of this construction may be used alone or in arrays as the white light illumination source for lamps or alternately as very high brightness, direct-view white indicators. Three ways of accomplishing this are of particular importance.

In the first version of the white illuminator embodiment, the device contains a plurality of visible light emitting LED chips as emitters such that the light emitted by at least one of the LED chips is projected and mixed with the light emitted and projected by another of the LED chips to form binary complementary white illumination, in accordance with the teachings of U.S. Pat. No. 5,803,579 to Turnbull et al., hereby incorporated herein in its entirety by reference. LED chips having a peak emission wavelength between about 580 and 610 nm may be used in conjunction with LED chips having a peak emission wavelength between about 480 and 510 nm to achieve such a binary complementary additive color mixture. Devices of this construction may be used alone or in arrays as the white light source for lamps or alternately as very high brightness, direct-view indicators. If the two chips are of inverted electrical polarity relative to one another, as discussed hereinabove, and electrically configured in the device as depicted in FIG. 7c, then the chromaticity and color temperature of the white illumination projected by the device may be adjusted by adjusting the value of optional shunt resistor 708 or by omitting the shunt resistor and manipulating the relative current drawn through electrical leads 705 and 706 via an external circuit (not shown).

In a second version of the white illuminator embodiment, the device contains a plurality of visible LED chips as emitters such that the light emitted by at least one of the LED chips is projected and mixed with the light emitted and projected by two other of the LED chips to form ternary complementary white illumination, such as RGB. Devices of this construction may be used alone or in arrays as the white light source for luminaires or alternately as very high brightness, direct-view indicators. If two of the three chips are of inverted electrical polarity relative to one another, as discussed hereinabove, and electrically configured in the device as depicted in FIG. 7c, then the chromaticity and color temperature of the white illumination projected by the device may be adjusted by adjusting the value of optional shunt resistor 708 or by omitting the shunt resistor and manipulating the relative current drawn through electrical leads 705 and 706 via an external circuit (not shown).

In a third version of the white illuminator embodiment, the device contains one or more LED chips with peak emission less than 550 nm as emitters in combination with a fluorescent media (e.g., a fluorescent dye or phosphor) contained within the device encapsulant. In this version, some light emitted by at least one of the LED chips is absorbed by the fluorescent media and re-emitted at one or more longer visible wavelengths such that the re-emitted light alone or in combination with emitted light not absorbed by the media is projected from white illumination.

In the first version and second version of white light embodiments of the present invention discussed hereinabove, the inventors have discovered optical configurations of particular utility. Referring to FIGS. 4, 16b, 17, 9b, and 22, for example, lens surface 401 may be optimized to provide collimation and mixing of the visible light emitted by the plurality of emitters in the device. This optimization involves: 1) increasing intensity of the beam emanating from the package by reducing the outward-convex radius of curvature of the lens surface or by disposing this surface at a distance from the emitters close to the focal length of the lens surface; and 2) increasing the imaging spot size of the lens surface and improving beam mixing by increasing the outward-convex radius of curvature of the lens surface or by disposing this surface at a distance from the emitters as far as practical from the focal length of the lens surface. In a preferred embodiment of the present invention, lens surface 401 is a convex lens with a radius of curvature of about 4.25 mm±1.0 mm, the aperture of the lens is about 6.5 to 10.5 mm, and the distance between the top or crown of lens surface 401 to the top of the emitters is about 5.5 mm±1.0 mm.

While the invention has been described in detail herein in accordance with certain preferred embodiments thereof, many modifications and changes therein may be effected by those skilled in the art without materially departing from the novel teachings and advantages of this invention. Accordingly, all such modifications are intended to be included within the scope of this invention as defined in the following claims and, therefore, it is our intent to be limited only by the scope of the appending claims and not by way of the details and instrumentalities describing the embodiments shown herein.

The invention claimed is:

1. A semiconductor radiation emitter package comprising:
   a heat extraction element;
   at least two electrical leads having a greater thermal resistance than said heat extraction element;
   at least one semiconductor radiation emitter mounted on a first surface of said heat extraction element, wherein when said at least one semiconductor radiation emitter is activated, the semiconductor radiation emitter package emits white light; and
   an encapsulant covering said at least one semiconductor radiation emitter, at least a portion of said encapsulant being substantially transparent to wavelengths emitted by said at least one semiconductor radiation emitter, said encapsulant material covering a portion of the first surface of said heat extraction element, while leaving exposed at least a portion of a second surface of said heat extraction element that is opposite the first surface, the exposed portion of the second surface being directly opposite an area of the first surface where said at least one semiconductor radiation emitter is mounted.

2. The semiconductor radiation emitter package of claim 1, wherein the exposed portion of the heat extraction member includes a region generally directly opposite a location on the first surface where said at least one semiconductor radiation emitter is mounted, and wherein said heat extraction member provides a primary thermal path out of the device from said at least one semiconductor radiation emitter and said electrical leads provide a secondary thermal path out of the device from said at least one semiconductor radiation emitter, said secondary thermal path possessing thermal resistance greater than said primary thermal path.

3. The semiconductor radiation emitter package of claim 1, wherein said heat extraction element has a thickness in a direction that is substantially parallel to the direction in which radiation is emitted from the semiconductor radiation emitter package that is greater than the thickness of said electrical leads.

4. The semiconductor radiation emitter package of claim 1, wherein said encapsulant comprises a first hard molding compound and a second hard molding compound, said first hard molding compound is substantially transparent to radiation emitted by said at least one semiconductor radiation emitter and is provided within the optical path of radiation emitted from said at least one semiconductor radiation emitter.

5. The semiconductor radiation emitter package of claim 4, wherein said second hard molding compound covers a portion of the first surface of said heat extraction element, while leaving exposed at least a portion of a second surface of said heat extraction element that is opposite the first surface, the exposed portion of the second surface being directly opposite an area of the first surface where said at least one semiconductor radiation emitter is mounted.

6. The semiconductor radiation emitter package of claim 5, wherein said second hard molding compound is substantially opaque.

7. The semiconductor radiation emitter package of claim 1, wherein the heat extraction member comprises a depression containing the at least one semiconductor radiation emitter.

8. The semiconductor radiation emitter package of claim 7, wherein the depression is coated with an optically reflective coating.

9. The semiconductor radiation emitter package of claim 1, wherein the heat extraction member comprises at least one of fins, slots, and holes to increase surface area outside the portion of the heat extraction member covered with the encapsulant.

10. The semiconductor radiation emitter package of claim 1, wherein a portion of the encapsulant is formed as a lens.

11. The semiconductor radiation emitter package of claim 1, wherein the encapsulant comprises a filler component and a bulk component, the filler component lowering the thermal coefficient of expansion of the bulk component, the filler component having an index of refraction nearly matching the index of refraction of the bulk component.

12. The semiconductor radiation emitter package of claim 1, wherein the encapsulant comprises a filler component operative to diffuse semiconductor radiation emitter output radiation.

13. The semiconductor radiation emitter package of claim 1, wherein the semiconductor radiation emitter comprises a conductive base in electrical contact with the heat extraction member.

14. The semiconductor radiation emitter package of claim 1, wherein the at least one semiconductor radiation emitter comprises a light emitting diode.

15. The semiconductor radiation emitter package of claim 1, wherein the at least one semiconductor radiation emitter comprises a light emitting polymer.

16. The semiconductor radiation emitter package of claim 1 and further comprising a fluorescent material.

17. The semiconductor radiation emitter package of claim 1 further comprising a heat sink in thermal contact with the heat extraction member.

18. The semiconductor radiation emitter package of claim 1, wherein:
said encapsulant forms a plurality of sides;
each of said electrical leads extends through one of a first set of encapsulant sides; and
said heat extraction member extends through at least one of a second set of encapsulant sides, the second set of encapsulant sides is different from the first set of encapsulant sides.

19. The semiconductor radiation emitter package of claim 18, wherein the first set of encapsulant sides comprises a first side and the second set of encapsulant sides comprises a second side opposite the first side.

20. The semiconductor radiation emitter package of claim 18, wherein the first set of encapsulant sides comprises opposing sides.

21. The semiconductor radiation emitter package of claim 18, wherein the second set of encapsulant sides comprises opposing sides.

22. The semiconductor radiation emitter package of claim 1, wherein at least two of said electrical leads are retained by said encapsulant.

23. The semiconductor radiation emitter package of claim 1, wherein said encapsulant covers a portion of said heat extraction member equal to or less than 65% of the total surface area of said heat extraction member.

24. The semiconductor radiation emitter package of claim 1, wherein the bulk of said electrical leads and said heat extraction member are composed substantially of the same material.

25. The semiconductor radiation emitter package of claim 1, wherein said at least one semiconductor radiation emitter includes two semiconductor radiation emitters that emit illumination having binary complementary hues that may mix to form white light.

26. The semiconductor radiation emitter package of claim 1, wherein said at least one semiconductor radiation emitter includes three semiconductor radiation emitters that emit illumination having ternary complementary hues that may mix to form white light.

27. The semiconductor radiation emitter package of claim 26, wherein a first one of said three semiconductor radiation emitters emits illumination having a red hue, a second one of said three semiconductor radiation emitters emits illumination having a green hue, and a third one of said three semiconductor radiation emitters emits illumination having a blue hue.

28. The semiconductor radiation emitter package of claim 1, wherein the semiconductor radiation emitter package has a power capacity of at least about 150 mW.

29. The semiconductor radiation emitter package of claim 1, and further comprising at least one recessed optically reflective cup formed in the heat extraction member, said at least one semiconductor radiation emitter being mounted within said at least one recessed optically reflective cup, wherein the depth of said at least one recessed optically reflective cup is equal to or greater than the height of said at least one semiconductor radiation emitter, each measured in the dimension parallel to the optical axis of the reflective cup within which said at least one semiconductor radiation emitter is mounted.

30. The semiconductor radiation emitter package of claim 1, wherein a cross-sectional area of said heat extraction element measured in a plane normal to the path between the at least one semiconductor radiation emitter and the nearest unencapsulated surface of said heat extraction element is greater than a cross-sectional area of each of said electrical leads measured in a plane that is normal to the path of heat flow between said at least one semiconductor radiation emitter and the nearest unencapsulated surface of said electrical leads during operation of the package.

31. The semiconductor radiation emitter package of claim 1, wherein said encapsulant includes a top surface through which radiation from said at least one semiconductor radiation emitter is emitted and further including a bottom surface, opposite said top surface, said encapsulant is formed to allow the exposed portion of the bottom surface of said heat extraction member to be exposed through the bottom surface of the encapsulant.

32. The semiconductor radiation emitter package of claim 1, wherein said heat extraction member is made of a material having a substantially high thermal conductivity.

33. The semiconductor radiation emitter package of claim 32, wherein said material is selected from the group consisting of a ceramic material, copper, copper alloys, aluminum, soft steel, or other metal.

34. The semiconductor radiation emitter package of claim 1, wherein the thermal path from said semiconductor radiation emitter to the exposed portion of the bottom surface of said heat extraction member is shorter than the thermal path from said semiconductor radiation emitter to a location where said electrical leads emerge from said encapsulant.

35. The semiconductor radiation emitter package of claim 1, wherein the exposed portion of said heat extraction member is coated with a coating material having improved thermal emissivity.

36. The semiconductor radiation emitter package of claim 35, wherein said coating material is selected from the group consisting of nichrome and black-oxide.

37. The semiconductor radiation emitter package of claim 1, wherein the exposed portion of said heat extraction member is textured.

38. The semiconductor radiation emitter package of claim 37, wherein the exposed portion of said heat extraction member has a matte finish.

39. The semiconductor radiation emitter package of claim 1, wherein the exposed portion of the heat extraction member includes a region opposite the primary direction of optical radiation emission from said at least one semiconductor radiation emitter.

40. The semiconductor radiation emitter package of claim 1, wherein said encapsulant comprises two different materials.

41. The semiconductor radiation emitter package of claim 40, wherein one of said two different materials is a transparent epoxy.

42. The semiconductor radiation emitter package of claim 40, wherein one of said two different materials is a stress relieving gel.

43. The semiconductor radiation emitter package of claim 42, wherein the stress relieving gel is silicone.

44. The semiconductor radiation emitter package of claim 42, wherein the stress relieving gel is applied over said at least one semiconductor radiation emitter.

45. The semiconductor radiation emitter package of claim 44, wherein one of said two different materials is a hard molding compound that is formed over the stress relieving gel.

46. The semiconductor radiation emitter package of claim 45, wherein said hard molding compound is epoxy.

47. The semiconductor radiation emitter package of claim 40, wherein said two different materials include a first hard molding compound and a second hard molding compound.

48. The semiconductor radiation emitter package of claim 47, wherein said first hard molding compound is substantially transparent to radiation emitted by said at least one semiconductor radiation emitter.

49. The semiconductor radiation emitter package of claim 48, wherein said first hard molding compound is provided within an optical path of said at least one semiconductor radiation emitter and is shaped to define a lens.

50. The semiconductor radiation emitter package of claim 49, wherein said second hard molding compound is provided in regions not within the optical path of said at least one semiconductor radiation emitter.

51. The semiconductor radiation emitter package of claim 50, wherein said second hard molding component is substantially opaque.

52. The semiconductor radiation emitter package of claim 47, wherein said second hard molding compound is provided where said encapsulant retains said electrical leads.

53. The semiconductor radiation emitter package of claim 1, wherein said encapsulant is molded directly onto a portion of said heat extraction element.

54. The semiconductor radiation emitter package of claim 1, wherein said encapsulant defines a plurality of sides and said heat extraction element extends out through two of said sides.

55. The semiconductor radiation emitter package of claim 47, wherein said second hard molding compound defines a plurality of sides and said heat extraction element extends out through two of said sides.

56. The semiconductor radiation emitter package of claim 1, wherein said encapsulant is made of a single transparent material.

57. A semiconductor radiation emitter package comprising:
 a heat extraction element;
 at least two electrical leads having a greater thermal resistance than said heat extraction element;
 at least one semiconductor radiation emitter mounted on a first surface of said heat extraction element, wherein when said at least one semiconductor radiation emitter is activated, the semiconductor radiation emitter package emits white light; and
 a first hard molding compound and a second hard molding compound, said first hard molding compound is substantially transparent to radiation emitted by said at least one semiconductor radiation emitter and is provided within the optical path of radiation emitted from said at least one semiconductor radiation emitter, wherein said second hard molding compound covers a portion of the first surface of said heat extraction element, while leaving exposed at least a portion of a second surface of said heat extraction element that is opposite the first surface, the exposed portion of the second surface being directly opposite an area of the first surface where said at least one semiconductor radiation emitter is mounted.

58. The semiconductor radiation emitter package of claim 57, wherein said heat extraction element having a thickness in a direction that is substantially parallel to the direction in which radiation is emitted from the semiconductor radiation emitter package that is greater than the thickness of said electrical leads.

59. The semiconductor radiation emitter package of claim 57 and further comprising a second hard molding compound covering a portion of said heat extraction element, while leaving exposed a portion of said heat extraction element, said second hard molding compound being different from said first hard molding compound and encapsulating a portion of said electrical leads so as to retain said electrical leads.

60. The semiconductor radiation emitter package of claim 57, wherein the heat extraction member comprises a depression containing the at least one semiconductor radiation emitter.

61. The semiconductor radiation emitter package of claim 60, wherein the depression is coated with an optically reflective coating.

62. The semiconductor radiation emitter package of claim 57, wherein the heat extraction member comprises at least one of fins, slots, and holes to increase surface area outside the portion of the heat extraction member covered with the encapsulant.

63. The semiconductor radiation emitter package of claim 57, wherein a portion of the first hard molding compound is formed as a lens.

64. The semiconductor radiation emitter package of claim 57, wherein the encapsulant comprises a filler component and a bulk component, the filler component lowering the thermal coefficient of expansion of the bulk component, the filler component having an index of refraction nearly matching the index of refraction of the bulk component.

65. The semiconductor radiation emitter package of claim 57, wherein the semiconductor radiation emitter comprises a conductive base in electrical contact with the heat extraction member.

66. The semiconductor radiation emitter package of claim 57, wherein the at least one semiconductor radiation emitter comprises a light emitting diode.

67. The semiconductor radiation emitter package of claim 57 and further comprising a fluorescent material.

68. The semiconductor radiation emitter package of claim 57, wherein the bulk of said electrical leads and said heat extraction member are composed substantially of the same material.

69. The semiconductor radiation emitter package of claim 57, wherein said at least one semiconductor radiation emitter includes two semiconductor radiation emitters that emit illumination having binary complementary hues that may mix to form white light.

70. The semiconductor radiation emitter package of claim 57, wherein said at least one semiconductor radiation emitter includes three semiconductor radiation emitters that emit illumination having ternary complementary hues that may mix to form white light.

71. The semiconductor radiation emitter package of claim 57, wherein the semiconductor radiation emitter package has a power capacity of at least about 150 mW.

72. The semiconductor radiation emitter package of claim 57, and further comprising at least one recessed optically reflective cup formed in the heat extraction member, said at least one semiconductor radiation emitter being mounted within said at least one recessed optically reflective cup, wherein the depth of said at least one recessed optically reflective cup is equal to or greater than the height of said at least one semiconductor radiation emitter, each measured in the dimension parallel to the optical axis of the reflective cup within which said at least one semiconductor radiation emitter is mounted.

73. A semiconductor radiation emitter package comprising:
a heat extraction element;
at least two electrical leads having a greater thermal resistance than said heat extraction element, said heat extraction element having a thickness in a direction that is substantially parallel to the direction in which radiation is emitted from the semiconductor radiation emitter package that is greater than the thickness of said electrical leads;
at least one semiconductor radiation emitter mounted on said heat extraction element, wherein when said at least one semiconductor radiation emitter is activated, the semiconductor radiation emitter package emits white light; and
a first hard molding compound covering said at least one semiconductor radiation emitter, at least a portion of said first hard molding compound being substantially transparent to wavelengths emitted by said at least one semiconductor radiation emitter.

74. The semiconductor radiation emitter package of claim 73, wherein said first hard molding compound is part of an encapsulant that encapsulates said at least one semiconductor radiation emitter.

75. The semiconductor radiation emitter package of claim 73, wherein the thickness of the heat extraction element is at least three times the thickness of the electrical leads.

76. The semiconductor radiation emitter package of claim 73 and further comprising a second hard molding compound covering a portion of said heat extraction element, while leaving exposed a portion of said heat extraction element, said second hard molding compound being different from said first hard molding compound and encapsulating a portion of said electrical leads so as to retain said electrical leads.

77. The semiconductor radiation emitter package of claim 73, wherein said first hard molding compound covers a portion of said heat extraction element and a portion of said electrical leads while leaving portions of both said heat extraction element and said electrical leads uncovered.

78. The semiconductor radiation emitter package of claim 77, wherein a cross-sectional area of said heat extraction element measured in a plane normal to the path between said at least one semiconductor radiation emitter and the nearest uncovered surface of said heat extraction element is greater than a cross-sectional area of each of said electrical leads measured in a plane that is normal to the path of heat flow between said at least one semiconductor radiation emitter and the nearest unencapsulated surface of said electrical leads, during operation of the package.

79. The semiconductor radiation emitter package of claim 73, wherein the heat extraction member comprises a depression containing the at least one semiconductor radiation emitter.

80. The semiconductor radiation emitter package of claim 79, wherein the depression is coated with an optically reflective coating.

81. The semiconductor radiation emitter package of claim 73, wherein a portion of the first hard molding compound is formed as a lens.

82. The semiconductor radiation emitter package of claim 73, wherein the semiconductor radiation emitter comprises a conductive base in electrical contact with the heat extraction member.

83. The semiconductor radiation emitter package of claim 73, wherein the at least one semiconductor radiation emitter comprises a light emitting diode.

84. The semiconductor radiation emitter package of claim 73 and further comprising a fluorescent material.

85. The semiconductor radiation emitter package of claim 73, wherein the bulk of said electrical leads and said heat extraction member are composed substantially of the same material.

86. The semiconductor radiation emitter package of claim 73, wherein said at least one semiconductor radiation emitter includes two semiconductor radiation emitters that emit illumination having binary complementary hues that may mix to form white light.

87. The semiconductor radiation emitter package of claim 73, wherein said at least one semiconductor radiation emitter includes three semiconductor radiation emitters that emit illumination having ternary complementary hues that may mix to form white light.

88. The semiconductor radiation emitter package of claim 73, wherein the semiconductor radiation emitter package has a power capacity of at least about 150 mW.

89. The semiconductor radiation emitter package of claim 73, and further comprising at least one recessed optically reflective cup formed in the heat extraction member, said at least one semiconductor radiation emitter being mounted within said at least one recessed optically reflective cup, wherein the depth of said at least one recessed optically reflective cup is equal to or greater than the height of said at least one semiconductor radiation emitter, each measured in the dimension parallel to the optical axis of the reflective cup within which said at least one semiconductor radiation emitter is mounted.

90. A semiconductor radiation emitter package comprising:
a heat extraction element;
at least two electrical leads having a greater thermal resistance than said heat extraction element;
at least one semiconductor radiation emitter mounted on a first surface of said heat extraction element; and an encapsulant encapsulating said at least one semiconductor radiation emitter, a portion of said heat extraction element and a portion of said electrical leads, wherein a cross-sectional area of said heat extraction element measured in a plane normal to the path between said at least one semiconductor radiation emitter and the nearest unencapsulated surface of said heat extraction element is greater than a cross-sectional area of each of said electrical leads measured in a plane that is normal to the path of heat flow between said at least one semiconductor radiation emitter and the nearest unencapsulated surface of said electrical leads during operation of the package, wherein said encapsulant defines a plurality of sides and said heat extraction element extends out through two of said sides.

91. The semiconductor radiation emitter package of claim 90, wherein said heat extraction element having a thickness in a direction that is substantially parallel to the direction in which radiation is emitted from the semiconductor radiation emitter package that is greater than the thickness of said electrical leads.

92. The semiconductor radiation emitter package of claim 90, wherein said encapsulant comprises a first hard molding compound and a second hard molding compound, said first hard molding compound is substantially transparent to radiation emitted by said at least one semiconductor radiation emitter and is provided within the optical path of radiation emitted from said at least one semiconductor radiation emitter.

93. The semiconductor radiation emitter package of claim 92, wherein said second hard molding compound covers a portion of the first surface of said heat extraction element, while leaving exposed at least a portion of a second surface of said heat extraction element that is opposite the first surface, the exposed portion of the second surface being directly opposite an area of the first surface where said at least one semiconductor radiation emitter is mounted.

94. The semiconductor radiation emitter package of claim 90, wherein the heat extraction member comprises a depression containing the at least one semiconductor radiation emitter.

95. The semiconductor radiation emitter package of claim 94, wherein the depression is coated with an optically reflective coating.

96. The semiconductor radiation emitter package of claim 90, wherein a portion of the encapsulant is formed as a lens.

97. The semiconductor radiation emitter package of claim 90, wherein the encapsulant comprises a filler component and a bulk component, the filler component lowering the thermal coefficient of expansion of the bulk component, the filler component having an index of refraction nearly matching the index of refraction of the bulk component.

98. The semiconductor radiation emitter package of claim 90, wherein the semiconductor radiation emitter comprises a conductive base in electrical contact with the heat extraction member.

99. The semiconductor radiation emitter package of claim 90, wherein the at least one semiconductor radiation emitter comprises a light emitting diode.

100. The semiconductor radiation emitter package of claim 90 and further comprising a fluorescent material.

101. The semiconductor radiation emitter package of claim 90, wherein at least two of said electrical leads are retained by said encapsulant.

102. The semiconductor radiation emitter package of claim 90, wherein said encapsulant covers a portion of said heat extraction member equal to or less than 65% of the total surface area of said heat extraction member.

103. The semiconductor radiation emitter package of claim 90, wherein the bulk of said electrical leads and said heat extraction member are composed substantially of the same material.

104. The semiconductor radiation emitter package of claim 90, wherein said at least one semiconductor radiation emitter includes two semiconductor radiation emitters that emit illumination having binary complementary hues that may mix to form white light.

105. The semiconductor radiation emitter package of claim 90, wherein said at least one semiconductor radiation emitter includes three semiconductor radiation emitters that emit illumination having ternary complementary hues that may mix to form white light.

106. The semiconductor radiation emitter package of claim 90, wherein the semiconductor radiation emitter package has a power capacity of at least about 150 mW.

107. The semiconductor radiation emitter package of claim 90, and further comprising at least one recessed optically reflective cup formed in the heat extraction member, said at least one semiconductor radiation emitter being mounted within said at least one recessed optically reflective cup, wherein the depth of said at least one recessed optically reflective cup is equal to or greater than the height of said at least one semiconductor radiation emitter, each measured in the dimension parallel to the optical axis of the reflective cup within which said at least one semiconductor radiation emitter is mounted.

108. The semiconductor radiation emitter package of claim 90, wherein said encapsulant comprises two different materials.

109. The semiconductor radiation emitter package of claim 108, wherein one of said two different materials is a transparent epoxy.

110. The semiconductor radiation emitter package of claim 108, wherein one of said two different materials is a stress relieving gel.

111. The semiconductor radiation emitter package of claim 110, wherein the stress relieving gel is silicone.

112. The semiconductor radiation emitter package of claim 110, wherein the stress relieving gel is applied over said at least one semiconductor radiation emitter.

113. The semiconductor radiation emitter package of claim 112, wherein one of said two different materials is a hard molding compound that is formed over the stress relieving gel.

114. The semiconductor radiation emitter package of claim 113, wherein said hard molding compound is epoxy.

115. The semiconductor radiation emitter package of claim 108, wherein said two different materials include a first hard molding compound and a second hard molding compound.

116. The semiconductor radiation emitter package of claim 115, wherein said first hard molding compound is substantially transparent to radiation emitted by said at least one semiconductor radiation emitter.

117. The semiconductor radiation emitter package of claim 116, wherein said first hard molding compound is provided within an optical path of said at least one semiconductor radiation emitter and is shaped to define a lens.

118. The semiconductor radiation emitter package of claim 117, wherein said second hard molding compound is provided in regions not within the optical path of said at least one semiconductor radiation emitter.

119. The semiconductor radiation emitter package of claim 118, wherein said second hard molding component is substantially opaque.

120. The semiconductor radiation emitter package of claim 115, wherein said second hard molding compound is provided where said encapsulant retains said electrical leads.

121. The semiconductor radiation emitter package of claim 90, wherein said encapsulant is molded directly onto a portion of said heat extraction element.

122. The semiconductor radiation emitter package of claim 90, wherein said second hard molding compound is molded directly onto a portion of said heat extraction element.

123. A semiconductor radiation emitter package comprising:
a heat extraction element;
at least two electrical leads having a greater thermal resistance than said heat extraction element;
at least one semiconductor radiation emitter mounted on a first surface of said heat extraction element, wherein when said at least one semiconductor emitter is activated, the semiconductor radiation emitter package emits white light;
a first hard molding compound substantially transparent to radiation emitted by said at least one semiconductor radiation emitter, said first hard molding compound is provided within the optical path of radiation emitted from said at least one semiconductor radiation emitter; and
a second hard molding compound covering a portion of said heat extraction element, while leaving exposed a portion of said heat extraction element, said second hard molding compound being different from said first hard molding compound and encapsulating a portion of said electrical leads so as to retain said electrical leads.

124. The semiconductor radiation emitter package of claim 123, wherein said heat extraction element having a thickness in a direction that is substantially parallel to the direction in which radiation is emitted from the semiconductor radiation emitter package that is greater than the thickness of said electrical leads.

125. The semiconductor radiation emitter package of claim 123, wherein said second hard molding compound is substantially opaque.

126. The semiconductor radiation emitter package of claim 123, wherein said heat extraction element includes a first surface on which said at least one semiconductor radiation emitter is mounted, said second hard molding compound covers a portion of the first surface of said heat extraction element, while leaving exposed at least a portion of a second surface of said heat extraction element that is opposite the first surface, the exposed portion of the second surface being directly opposite an area of the first surface where said at least one semiconductor radiation emitter is mounted.

127. The semiconductor radiation emitter package of claim 123, wherein the heat extraction member comprises a depression containing the at least one semiconductor radiation emitter.

128. The semiconductor radiation emitter package of claim 127, wherein the depression is coated with an optically reflective coating.

129. The semiconductor radiation emitter package of claim 123, wherein a portion of the first hard molding compound is formed as a lens.

130. The semiconductor radiation emitter package of claim 123, wherein the semiconductor radiation emitter comprises a conductive base in electrical contact with the heat extraction member.

131. The semiconductor radiation emitter package of claim 123, wherein the at least one semiconductor radiation emitter comprises a light emitting diode.

132. The semiconductor radiation emitter package of claim 123 and further comprising a fluorescent material.

133. The semiconductor radiation emitter package of claim 132, wherein said fluorescent material is dispersed in said encapsulant.

134. The semiconductor radiation emitter package of claim 133, wherein said fluorescent material is one or more of a fluorescent dye, pigment and phosphor.

135. The semiconductor radiation emitter package of claim 123, wherein:
said second hard molding compound forms a plurality of sides;
each of said electrical leads extends through one of a first set of the sides; and
said heat extraction member extends through at least one of a second set of the sides, the second set of the sides different from the first set of the sides.

136. The semiconductor radiation emitter package of claim 123, wherein the bulk of said electrical leads and said heat extraction member are composed substantially of the same material.

137. The semiconductor radiation emitter package of claim 123, wherein said at least one semiconductor radiation emitter includes two semiconductor radiation emitters that emit illumination having binary complementary hues that may mix to form white light.

138. The semiconductor radiation emitter package of claim 123, wherein said at least one semiconductor radiation emitter includes three semiconductor radiation emitters that emit illumination having ternary complementary hues that may mix to form white light.

139. The semiconductor radiation emitter package of claim 123, wherein the semiconductor radiation emitter package has a power capacity of at least about 150 mW.

140. The semiconductor radiation emitter package of claim 123, and further comprising at least one recessed optically reflective cup formed in the heat extraction member, said at least one semiconductor radiation emitter being mounted within said at least one recessed optically reflective cup, wherein the depth of said at least one recessed optically reflective cup is equal to or greater than the height of said at least one semiconductor radiation emitter, each measured in the dimension parallel to the optical axis of the reflective cup within which said at least one semiconductor radiation emitter is mounted.

141. The semiconductor radiation emitter package of claim 123, wherein said second hard molding compound is molded directly onto a portion of said heat extraction element.

142. The semiconductor radiation emitter package of claim 123, wherein said encapsulant defines a plurality of sides and said heat extraction element extends out through two of said sides.

143. The semiconductor radiation emitter package of claim 123, wherein said second hard molding compound defines a plurality of sides and said heat extraction element extends out through two of said sides.

144. The semiconductor radiation emitter package of claim 123, wherein said first hard molding compound is made of a single transparent material.

145. An LED package comprising:

a heat extraction element having a first surface and a second surface that is opposite the first surface;

a first electrical lead and a second electrical lead, said electrical leads having a greater thermal resistance than said heat extraction element;

an LED chip mounted to the first surface of said heat extraction element for emitting light generally along an optical path, wherein said LED chip is energized via said first and second electrical leads, when said LED chip is energized, the LED package is capable of emitting white light; and an encapsulant covering a portion of said first and second electrical leads, said LED chip, and a portion of said heat extraction element, said encapsulant is formed to leave exposed at least a portion of the second surface of said heat extraction member, the exposed portion of said heat extraction member including a region generally directly opposite a location on the first surface where said LED chip is mounted, wherein said encapsulant comprises two different materials including a first hard molding compound and a second hard molding compound, said first hard molding compound is substantially transparent to light emitted by said LED chip and is provided within the optical path of light emitted from said LED chip and is shaped to define a lens, wherein said second hard molding compound is provided where said encapsulant covers said electrical leads and in regions generally not within the optical path of light emitted from said LED chip, said second hard molding compound is substantially opaque, wherein a cross-sectional area of said heat extraction element measured in a plane normal to the path between said LED chip and the nearest exposed surface of said heat extraction element is greater than a cross-sectional area of each of said electrical leads measured in a plane that is normal to the path of heat flow between said LED chip and the nearest exposed surface of said electrical leads, during operation of the package, wherein said encapsulant forms a plurality of sides, said first and second electrical leads extend through one of a first set of encapsulant sides, said heat extraction member extends through at least one of a second set of encapsulant sides including at least two sides, the second set of encapsulant sides different from the first set of encapsulant sides, and wherein said heat extraction element having a thickness in a direction that is substantially parallel to the direction in which light is emitted from the LED package that is greater than the thickness of said electrical leads.

146. The LED package of claim 145, wherein said first hard molding compound is a transparent epoxy.

147. The LED package of claim 145, wherein said encapsulant further comprises a stress relieving gel.

148. The LED package of claim 147, wherein the stress relieving gel is silicone.

149. The LED package of claim 147, wherein the stress relieving gel is applied over said LED chip.

150. The LED package of claim 145, wherein said first surface of said heat extraction element is a bottom surface that lies in a plane below a bottommost surface of said electrical leads and wherein said second hard molding compound does not extend below the plane of the bottom surface of said heat extraction element.

151. The LED package of claim 145, wherein said second set of sides of said encapsulant includes adjacent sides, and wherein said first set of sides of said encapsulant includes a single side of said encapsulant.

152. The LED package of claim 145 and further comprising an additional LED chip, wherein said LED chip and said additional LED chip emit illumination having binary complementary hues that may mix to form white light.

153. The LED package of claim 145 and further comprising a fluorescent material.

154. The LED package of claim 153, wherein said fluorescent material is one or more of a fluorescent dye, pigment and phosphor.

155. The LED package of claim 145, wherein the LED package has a power capacity of at least about 150 mW.

156. The LED package of claim 145, wherein said second hard molding compound is molded directly onto a portion of said heat extraction element.

* * * * *